(12) United States Patent
Vanhille et al.

(10) Patent No.: US 8,917,150 B2
(45) Date of Patent: Dec. 23, 2014

(54) WAVEGUIDE BALUN HAVING WAVEGUIDE STRUCTURES DISPOSED OVER A GROUND PLANE AND HAVING PROBES LOCATED IN CHANNELS

(75) Inventors: Kenneth Vanhille, Blacksburg, VA (US); David Sherrer, Radford, VA (US)

(73) Assignee: Nuvotronics, LLC, Radford, VA (US)

( * ) Notice: Subject to any disclaimer, the term of this patent is extended or adjusted under 35 U.S.C. 154(b) by 679 days.

(21) Appl. No.: 13/011,886

(22) Filed: Jan. 22, 2011

(65) Prior Publication Data

US 2011/0181376 A1    Jul. 28, 2011

Related U.S. Application Data

(60) Provisional application No. 61/297,712, filed on Jan. 22, 2010.

(51) Int. Cl.
| | |
|---|---|
| *H01P 5/10* | (2006.01) |
| *H01P 11/00* | (2006.01) |
| *H01P 3/06* | (2006.01) |
| *H03H 7/42* | (2006.01) |

(52) U.S. Cl.
CPC .............. *H01P 11/005* (2013.01); *H01P 5/10* (2013.01); *H01P 3/06* (2013.01); *H03H 7/42* (2013.01)
USPC ................................ 333/26; 333/245; 29/828

(58) Field of Classification Search
CPC ................................. H01P 5/10; H01P 11/005
USPC ................. 333/244, 243, 238, 26, 34; 29/828
See application file for complete search history.

(56) References Cited

U.S. PATENT DOCUMENTS

| | | | |
|---|---|---|---|
| 2,812,501 | A | 11/1957 | Sommers |
| 2,914,766 | A | 11/1959 | Butler |

(Continued)

FOREIGN PATENT DOCUMENTS

| | | |
|---|---|---|
| CA | 2055116 | 5/1992 |
| DE | 3623093 | 1/1988 |

(Continued)

OTHER PUBLICATIONS

Brown et al., "A Low-Loss Ka-Band Filter in Rectangular Coax Made by Electrochemical Fabrication", submitted to Microwave and Wireless Components Letters, date unknown (downloaded from www.memgen.com, 2004).

(Continued)

*Primary Examiner* — Benny Lee
(74) *Attorney, Agent, or Firm* — Niels Haun; Dann Dorfman Herrell & Skillman, PC

(57) ABSTRACT

An apparatus may include one or more conductive surfaces, waveguide structures and/or ports. One or more waveguide structures may include a portion disposed above a conductive surface, an outer conductor, and/or an inner conductor. A first portion of an outer conductor may be connected to a conductive surface. A port end of an outer conductor may be connected to an outer conductor port. An inner conductor may be disposed inside and spaced apart from an outer conductor. An inner conductor port may be connected to an inner conductor. An inner conductor of two or more waveguide structures may be connected to each other. A conductive surface may include at least one aperture portion, which may have a width substantially similar to the width of a waveguide structure. A substrate may be disposed between one or more waveguide structures and a conductive surface for a substantial portion of a waveguide structure.

22 Claims, 15 Drawing Sheets

(56) References Cited

U.S. PATENT DOCUMENTS

| | | |
|---|---|---|
| 2,997,519 A | 8/1961 | Hines et al. |
| 3,309,632 A | 3/1967 | Trudeau |
| 3,311,966 A | 4/1967 | Henry |
| 3,335,489 A | 8/1967 | Grant |
| 3,352,730 A | 11/1967 | Murch |
| 3,464,855 A | 9/1969 | Quintana |
| 3,560,896 A | 2/1971 | Essinger |
| 3,760,306 A | 9/1973 | Spinner et al. |
| 3,775,844 A | 12/1973 | Parks |
| 3,789,129 A | 1/1974 | Ditscheid |
| 3,791,858 A | 2/1974 | McPherson |
| 3,963,999 A | 6/1976 | Nakajima |
| 4,021,789 A | 5/1977 | Furman |
| 4,075,757 A | 2/1978 | Malm |
| 4,275,944 A | 6/1981 | Sochor |
| 4,348,253 A | 9/1982 | Subbarao |
| 4,365,222 A | 12/1982 | Lampert et al. |
| 4,414,424 A | 11/1983 | Mizoguchi et al. |
| 4,417,393 A | 11/1983 | Becker |
| 4,437,074 A | 3/1984 | Cohen et al. |
| 4,521,755 A | 6/1985 | Carlson et al. |
| 4,581,301 A | 4/1986 | Michaelson |
| 4,591,411 A | 5/1986 | Reimann |
| 4,641,140 A * | 2/1987 | Heckaman et al. .......... 342/371 |
| 4,663,497 A | 5/1987 | Reimann |
| 4,673,904 A | 6/1987 | Landis |
| 4,700,159 A | 10/1987 | Jones, III |
| 4,771,294 A | 9/1988 | Wasilousky |
| 4,808,273 A | 2/1989 | Hua |
| 4,853,656 A * | 8/1989 | Guillou et al. .................. 333/34 |
| 4,856,184 A | 8/1989 | Doeling |
| 4,857,418 A | 8/1989 | Schuetz |
| 4,876,322 A | 10/1989 | Budde et al. |
| 4,880,684 A | 11/1989 | Boss |
| 4,969,979 A | 11/1990 | Appelt et al. |
| 4,975,142 A | 12/1990 | Iannacone |
| 5,069,749 A | 12/1991 | Gutierrez |
| 5,072,201 A | 12/1991 | Devaux et al. |
| 5,100,501 A | 3/1992 | Blumenthal |
| 5,119,049 A | 6/1992 | Heller |
| 5,227,013 A | 7/1993 | Kumar |
| 5,334,956 A | 8/1994 | Leding et al. |
| 5,381,157 A | 1/1995 | Shiga |
| 5,406,235 A | 4/1995 | Hayashi et al. |
| 5,406,423 A | 4/1995 | Sato |
| 5,430,257 A | 7/1995 | Lau et al. |
| 5,454,161 A | 10/1995 | Beilin et al. |
| 5,622,895 A | 4/1997 | Frank |
| 5,633,615 A | 5/1997 | Quan |
| 5,682,062 A | 10/1997 | Gaul |
| 5,682,124 A | 10/1997 | Suski |
| 5,712,607 A | 1/1998 | Dittmer et al. |
| 5,724,012 A | 3/1998 | Teunisse |
| 5,746,868 A | 5/1998 | Abe |
| 5,793,272 A | 8/1998 | Burghartz et al. |
| 5,814,889 A | 9/1998 | Gaul |
| 5,860,812 A | 1/1999 | Gugliotti |
| 5,872,399 A | 2/1999 | Lee |
| 5,925,206 A | 7/1999 | Boyko |
| 5,961,347 A | 10/1999 | Hsu |
| 5,977,842 A * | 11/1999 | Brown et al. .................. 333/26 |
| 5,990,768 A | 11/1999 | Takahashi et al. |
| 6,008,102 A | 12/1999 | Alford et al. |
| 6,027,630 A | 2/2000 | Cohen |
| 6,054,252 A | 4/2000 | Lundy et al. |
| 6,180,261 B1 | 1/2001 | Inoue et al. |
| 6,210,221 B1 | 4/2001 | Maury |
| 6,228,466 B1 | 5/2001 | Tsukada |
| 6,294,965 B1 | 9/2001 | Merrill et al. |
| 6,350,633 B1 | 2/2002 | Lin |
| 6,388,198 B1 | 5/2002 | Bertin |
| 6,457,979 B1 | 10/2002 | Dove et al. |
| 6,465,747 B2 | 10/2002 | DiStefano |
| 6,466,112 B1 | 10/2002 | Kwon et al. |
| 6,514,845 B1 | 2/2003 | Eng |
| 6,518,165 B1 | 2/2003 | Yoon |
| 6,535,088 B1 | 3/2003 | Sherman et al. |
| 6,589,594 B1 | 7/2003 | Hembree |
| 6,600,395 B1 | 7/2003 | Handforth et al. |
| 6,603,376 B1 | 8/2003 | Handforth et al. |
| 6,648,653 B2 | 11/2003 | Huang |
| 6,662,443 B2 | 12/2003 | Chou |
| 6,677,248 B2 | 1/2004 | Kwon |
| 6,749,737 B2 | 6/2004 | Cheng |
| 6,800,360 B2 | 10/2004 | Miyanaga |
| 6,800,555 B2 | 10/2004 | Test |
| 6,827,608 B2 | 12/2004 | Hall |
| 6,850,084 B2 | 2/2005 | Hembree |
| 6,888,427 B2 | 5/2005 | Sinsheimer et al. |
| 6,943,452 B2 | 9/2005 | Bertin |
| 6,971,913 B1 | 12/2005 | Chu |
| 6,981,414 B2 | 1/2006 | Knowles et al. |
| 7,005,750 B2 | 2/2006 | Liu |
| 7,012,489 B2 | 3/2006 | Sherrer et al. |
| 7,064,449 B2 | 6/2006 | Lin |
| 7,077,697 B2 | 7/2006 | Kooiman |
| D530,674 S | 10/2006 | Ko |
| 7,129,163 B2 | 10/2006 | Sherrer |
| 7,148,141 B2 | 12/2006 | Shim et al. |
| 7,148,772 B2 | 12/2006 | Sherrer |
| 7,165,974 B2 | 1/2007 | Kooiman |
| 7,217,156 B2 | 5/2007 | Wang |
| 7,222,420 B2 | 5/2007 | Moriizumi |
| 7,239,219 B2 | 7/2007 | Brown et al. |
| 7,252,861 B2 | 8/2007 | Smalley |
| 7,259,640 B2 | 8/2007 | Brown et al. |
| 7,400,222 B2 | 7/2008 | Kwon et al. |
| 7,405,638 B2 | 7/2008 | Sherrer et al. |
| 7,449,784 B2 | 11/2008 | Sherrer et al. |
| 7,478,475 B2 | 1/2009 | Hall |
| 7,508,065 B2 | 3/2009 | Sherrer et al. |
| 7,575,474 B1 | 8/2009 | Dodson |
| 7,579,553 B2 | 8/2009 | Moriizumi |
| 7,602,059 B2 | 10/2009 | Nobutaka |
| 7,649,432 B2 | 1/2010 | Sherrer et al. |
| 7,656,256 B2 | 2/2010 | Houck et al. |
| 7,658,831 B2 | 2/2010 | Mathieu et al. |
| 7,705,456 B2 | 4/2010 | Hu |
| 7,755,174 B2 | 7/2010 | Rollin et al. |
| 7,898,356 B2 | 3/2011 | Sherrer et al. |
| 7,948,335 B2 | 5/2011 | Sherrer et al. |
| 8,011,959 B1 | 9/2011 | Tsai |
| 8,031,037 B2 | 10/2011 | Sherrer et al. |
| 8,304,666 B2 | 11/2012 | Ko |
| 8,339,232 B2 | 12/2012 | Lotfi |
| 8,441,118 B2 | 5/2013 | Hua |
| 8,522,430 B2 | 9/2013 | Kacker |
| 8,542,079 B2 | 9/2013 | Sherrer |
| 2002/0075104 A1 | 6/2002 | Kwon et al. |
| 2003/0029729 A1 | 2/2003 | Cheng et al. |
| 2003/0052755 A1 | 3/2003 | Barnes et al. |
| 2003/0117237 A1 | 6/2003 | Niu |
| 2003/0221968 A1 | 12/2003 | Cohen |
| 2003/0222738 A1 | 12/2003 | Brown et al. |
| 2004/0004061 A1 | 1/2004 | Merdan |
| 2004/0007468 A1 | 1/2004 | Cohen |
| 2004/0007470 A1 | 1/2004 | Smalley |
| 2004/0038586 A1 | 2/2004 | Hall |
| 2004/0076806 A1 | 4/2004 | Miyanaga et al. |
| 2004/0196112 A1* | 10/2004 | Welbon et al. .................. 333/1 |
| 2004/0263290 A1 | 12/2004 | Sherrer et al. |
| 2005/0030124 A1 | 2/2005 | Okamoto |
| 2005/0045484 A1 | 3/2005 | Smalley et al. |
| 2005/0156693 A1 | 7/2005 | Dove et al. |
| 2005/0230145 A1 | 10/2005 | Ishii et al. |
| 2005/0250253 A1 | 11/2005 | Cheung |
| 2008/0191817 A1 | 8/2008 | Sherrer |
| 2008/0199656 A1 | 8/2008 | Nichols et al. |
| 2008/0240656 A1 | 10/2008 | Rollin et al. |
| 2009/0154972 A1 | 6/2009 | Tanaka |
| 2010/0015850 A1 | 1/2010 | Stein |
| 2010/0109819 A1 | 5/2010 | Houck et al. |
| 2010/0296252 A1 | 11/2010 | Rollin et al. |
| 2011/0123783 A1 | 5/2011 | Sherrer |

(56) References Cited

U.S. PATENT DOCUMENTS

| | | | |
|---|---|---|---|
| 2011/0181376 | A1 | 7/2011 | Vanhille et al. |
| 2011/0181377 | A1 | 7/2011 | Vanhille et al. |
| 2011/0210807 | A1 | 9/2011 | Sherrer et al. |
| 2011/0273241 | A1 | 11/2011 | Sherrer et al. |
| 2013/0050055 | A1 | 2/2013 | Paradiso et al. |
| 2013/0127577 | A1 | 5/2013 | Lotfi |

FOREIGN PATENT DOCUMENTS

| | | |
|---|---|---|
| EP | 398019 | 11/1990 |
| EP | 0485831 | 5/1992 |
| EP | 845831 | 6/1998 |
| EP | 0911903 | 4/1999 |
| FR | 2086327 | 12/1971 |
| JP | 3027587 | 2/1991 |
| JP | 6085510 | 3/1994 |
| JP | 6302964 | 10/1994 |
| JP | H10041710 | 2/1998 |
| TW | I244799 | 12/2005 |
| WO | 0007218 | 2/2000 |
| WO | 0039854 | 7/2000 |
| WO | 02080279 | 7/2000 |
| WO | 0206152 | 1/2002 |
| WO | 2004004061 | 1/2004 |

OTHER PUBLICATIONS

Chwomnawang et al., "On-chip 3D Air Core Micro-Inductor for High-Frequency Applications Using Deformation of Sacrificial Polymer", Proc. SPIE, vol. 4334, pp. 54-62, Mar. 2001.
Cole, B.E., et al., Micromachined Pixel Arrays Integrated with CMOS for Infrared Applications, pp. 64-64 (2000).
De Los Santos, H.J., Introduction to Microelectromechanical (MEM) Microwave Systems (pp. 4, 7-8, 13) (1999).
Deyong, C., et al., A Microstructure Semiconductor Thermocouple for Microwave Power Sensors, 1997 Asia Pacific Microwave Conference, pp. 917-919.
Elliott Brown/MEMGen Corporation, "RF Applications of EFAB Technology", MTT-S IMS 2003, pp. 1-15.
Engelmann et al., "Fabrication of High Depth-to-Width Aspect Ratio Microstructures", IEEE Micro Electro Mechanical Systems (Feb. 1992), pp. 93-98.
Filipovic, et al., "Modeling, Design, Fabrication, and Performance of Rectangular u-Coaxial Lines and Components", Microwave Symposium Digest, 2006, IEEE; Jun. 1, 2006; pp. 1393-1396.
Franssila, S., Introduction to Microfabrication, (pp. 8) (2004).
Frazier et al., "Metallic Microstructures Fabricated Using Photosensitive Polyimide Electroplating Molds", Journal of Microelectromechanical Systems, vol. 2, No. 2, Jun. 1993, pp. 87-94.
Ghodisian, B., et al., Fabrication of Affordable Metallic Microstructures by Electroplating and Photoresist Molds, 1996, pp. 68-71.
H. Guckel, "High-Aspect-Ratio Micromachining Via Deep X-Ray Lithography", Proc. of IEEE, vol. 86, No. 8 (Aug. 1998), pp. 1586-1593.
Hawkins, C.F., The Microelectronics Failure Analysis, Desk Reference Edition (2004).
Jeong, Inho et al., "High-Performance Air-Gap Transmission Lines and Inductors for Millimeter-Wave Applications", IEEE Transactions on Microwave Theory and Techniques, Dec. 2002, pp. 2850-2855, vol. 50, No. 12.
Katehi et al., "MEMS and Si Micromachined Circuits for High-Frequency Applications", IEEE Transactions on Microwave Theory and Techniques, vol. 50, No. 3, Mar. 2002, pp. 858-866.
Kwok, P.Y., et al., Fluid Effects in Vibrating Micromachined Structures, Journal of Microelectromechanical Systems, vol. 14, No. 4, Aug. 2005, pp. 770-781.
Lee et al., "Micromachining Applications of a High Resolution Ultrathick Photoresist", J. Vac. Sci. Technol. B 13 (6), Nov./Dec. 1995, pp. 3012-3016.

Loechel et al., "Application of Ultraviolet Depth Lithography for Surface Micromachining", J. Vac. Sci. Technol. B 13 (6), Nov./Dec. 1995, pp. 2934-2939.
Madou, M.J., Fundamentals of Microfabrication: The Science of Miniaturization, 2d Ed., 2002 (Roadmap; pp. 615-668).
Park et al., "Electroplated Micro-Inductors and Micro-Transformers for Wireless application", IMAPS 2002, Denver, CO, Sep. 2002.
Sedky, S., Post-Processing Techniques for Integrated MEMS (pp. 9, 11, 164) (2006).
Tummala et al.; "Microelectronics Packaging Handbook"; Jan. 1, 1989; XP002477031; pp. 710-714.
Yeh, J.L., et al., Copper-Encapsulated Silicon Micromachined Structures, Journal of Microelectromechanical Systems, vol. 9, No. 3, Sep. 2000, pp. 281-287.
Yoon et al., "3-D Lithography and Metal Surface Micromachining for RF and Microwave MEMs" IEEE MEMS 2002 Conference, Las Vegas, NV, Jan. 2002, pp. 673-676.
Yoon et al., "CMOS-Compatible Surface Micromachined Suspended-Spiral Inductors for Multi-GHz Sillicon RF Ics", IEEE Electron Device Letters, vol. 23, No. 10, Oct. 2002, pp. 591-593.
Yoon et al., "High-Performance Electroplated Solenoid-Type Integrated Inductor (SI2) for RF Applications Using Simple 3D Surface Micromachining Technology", Int'l Election Devices Meeting, 1998, San Francisco, CA, Dec. 6-9, 1998, pp. 544-547.
Yoon et al., "High-Performance Three-Dimensional On-Chip Inductors Fabricated by Novel Micromahining Technology for RF MMIC", 1999 IEEE MTT-S Int'l Microwave Symposium Digest., vol. 4, Jun. 13-19, 1999, Anaheim, California, pp. 1523-1526.
Yoon et al., "Monolithic High-Q Overhang Inductors Fabricated on Silicon and Glass Substrates", International Electron Devices Meeting, Washington D.C. (Dec. 1999), pp. 753-756.
Yoon et al., "Monolithic Integration of 3-D Electroplated Microstructures with Unlimited Number of Levels Using Planarization with a Sacrificial Metallic Mole (PSMm)", Twelfth IEEE Int'l Conf. on Micro Electro mechanical systems, Orlando Florida, Jan. 1999, pp. 624-629.
Yoon et al., "Multilevel Microstructure Fabrication Using Single-Step 3D Photolithography and Single-Step Electroplating", Proc. of SPIE, vol. 3512, (Sep. 1998), pp. 358-366.
Saito, Y., Fontaine, D., Rollin, J-M., Filipovic, D., "Micro-Coaxial Ka-Band Gysel Power Dividers," Microwave Opt Technol Lett 52: 474-478, 2010.
Kenneth J. Vanhille et al.; Micro-Coaxial Impedance Transformers; Journal of Latex Class Files; vol. 6; No. 1; Jan. 2007.
Ali Darwish et al.; Vertical Balun and Wilkinson Divider; 2002 IEEE MTT-S Digest; pp. 109-112.
Sherrer, D, Vanhille, K, Rollin, J.M., "PolyStrata Technology: A Disruptive Approach for 3D Microwave Components and Modules," Presentation (Apr. 23, 2010).
European Search Report of Corresponding European Application No. 07 15 0467 mailed Apr. 28, 2008.
European Search Report of corresponding European Application No. 08 15 3138 mailed Jul. 4, 2008.
European Search Report of corresponding European Application No. 08153138.6 mailed Jul. 15, 2008.
Yoon et al., "High-Performance Electroplated Solenoid-Type Integrated Inductor (S12) for RF Applications Using Simple 3D Surface Micromachining Technology", Int'l Election Devices Meeting, 1998, San Francisco, CA, Dec. 6-9, 1998, pp. 544-547.
European Search Report of corresponding European Patent Application No. 08 15 3144 dated Jul. 2, 2008.
European Examination Report of corresponding European Patent Application No. 08 15 3144 dated Nov. 10, 2008.
European Examination Report of corresponding European Patent Application No. 08 15 3144 dated Apr. 6, 2010.
European Examination Report of corresponding European Patent Application No. 08 15 3144 dated Feb. 22, 2012.
International Preliminary Report on Patentability dated Jul. 24, 2012 for corresponding PCT/US2011/022173.
Written Opinion of the International Searching Authority dated Aug. 29, 2005 on corresponding PCT/US04/06665.
International Preliminary Report on Patentability dated May 19, 2006 on corresponding PCT/US04/06665.

(56) References Cited

OTHER PUBLICATIONS

International Search Report dated Aug. 29, 2005 on corresponding PCT/US04/06665.
European Search Report for corresponding EP Application No. 07150463.3 dated Apr. 23, 2012.
Jeong, I., et al., "High Performance Air-Gap Transmission Lines and Inductors for Milimeter-Wave Applications", Transactions on Microwave Theory and Techniques, vol. 50, No. 12, Dec. 2002.
PwrSoC Update 2012: Technology, Challenges, and Opportunities for Power Supply on Chip, Presentation (Mar. 18, 2013).
European Examination Report dated Mar. 21, 2013 for EP Application No. 07150463.3.
Chance, G.I. et al., "A suspended-membrane balanced frequency doubler at 200GHz," 29th International Conference on Infrared and Millimeter Waves and Terahertz Electronics, pp. 321-322, Karlsrube, 2004.
Immorlica, Jr., T. et al., "Miniature 3D micro-machined solid state power amplifiers," COMCAS 2008.
Ehsan, N. et al., "Microcoaxial lines for active hybrid-monolithic circuits," 2009 IEEE MTT-S Int. Microwave.Symp. Boston, MA, Jun. 2009.
Filipovic, D. et al., "Monolithic rectangular coaxial lines. Components and systems for commercial and defense applications," Presented at 2008 IASTED Antennas, Radar, and Wave Propagation Conferences, Baltimore, MD, USA, Apr. 2008.
Filipovic, D.S., "Design of microfabricated rectangular coaxial lines and components for mm-wave applications," Microwave Review, vol. 12, No. 2, Nov. 2006, pp. 11-16.
Ingram, D.L. et al., "A 427 mW 20% compact W-band InP HEMT MMIC power amplifier," IEEE RFIC Symp. Digest 1999, pp. 95-98.
Lukic, M. et al., "Surface-micromachined dual Ka-band cavity backed patch antennas," IEEE Trans. AtennasPropag., vol. 55, pp. 2107-2110, Jul. 2007.
Oliver, J.M. et al., "A 3-D micromachined W-band cavity backed patch antenna array with integrated rectacoax transition to wave guide," 2009 Proc. IEEE International Microwave Symposium, Boston, MA 2009.
Rollin, J.M. et al., "A membrane planar diode for 200GHz mixing applications," 29th International Conference on Infrared and Millimeter Waves and Terahertz Electronics, pp. 205-206, Karlsrube, 2004.
Rollin, J.M. et al., "Integrated Schottky diode for a sub-harmonic mixer at millimetre wavelengths," 31st International Conference on Infrared and Millimeter Waves and Terahertz Electronics, Paris, 2006.
Saito et al., "Analysis and design of monolithic rectangular coaxial lines for minimum coupling," IEEE Trans. Microwave Theory Tech., vol. 55, pp. 2521-2530, Dec. 2007.
Vanhille, K. et al., "Balanced low-loss Ka-band µ-coaxial hybrids," IEEE MTT-S Dig., Honolulu, Hawaii, Jun. 2007.
Vanhille, K. et al., "Ka-Band surface mount directional coupler fabricated using micro-rectangular coaxial transmission lines," 2008 Proc. IEEE International Microwave Symposium, 2008.
Vanhille, K.J. et al., "Ka-band miniaturized quasi-planar high-Q resonators," IEEE Trans. Microwave Theory Tech., vol. 55, No. 6, pp. 1272-1279, Jun. 2007.
Vyas R. et al., "Liquid Crystal Polymer (LCP): The ultimate solution for low-cost RF flexible electronics and antennas," Antennas and Propagation Society, International Symposium, p. 1729-1732 (2007).
Wang, H. et al., "Design of a low integrated sub-harmonic mixer at 183GHz using European Schottky diode technology," From Proceedings of the 4th ESA workshop on Millimetre-Wave Technology and Applications, pp. 249-252, Espoo, Finland, Feb. 2006.
Wang, H. et al., "Power-amplifier modules covering 70-113 GHz using MMICs," IEEE Trans Microwave Theory and Tech., vol. 39, pp. 9-16, Jan. 2001.
Vanhille, K., "Design and Characterization of Microfabricated Three-Dimensional Millimeter-Wave Components," Dissertation, 2007.
Ehsan, N., "Broadband Microwave Litographic 3D Components," Dissertation 2009.
Colantonio, P., et al., "High Efficiency RF and Microwave Solid State Power Amplifiers," pp. 380-395, 2009.

\* cited by examiner

WAVEGUIDE BALUN HAVING WAVEGUIDE STRUCTURES DISPOSED OVER A GROUND PLANE AND HAVING PROBES LOCATED IN CHANNELS

The present application claims priority to U.S. Provisional Patent Application No. 61/297,712 (tiled on Jan. 22, 2010), which is hereby incorporated by reference in its entirety.

BACKGROUND

Embodiments relate to electric, electronic and/or electromagnetic devices, and/or processes thereof. Some embodiments relate to waveguide structures and/or processes thereof, for example balun structures.

While an apparatus may be fabricated to include a co-planar waveguide, microstrip, stripline and/or coaxial line in a single process, there may be a need for varied transmission lines applied to the same circuit, co-existence of multiple transmission line topologies in substantially the same in-plane location, modification of a co-planar waveguide by an offset of an inner conductor from a plane of a ground conductor and/or use of an insulating substrate as part of a circuit. Furthermore, there may be a need to employ coaxial line for a main signal path to maximize and/or minimize characteristic impedance, maximize isolation and/or to minimize insertion loss. Moreover, there may be a need to use such an apparatus, for example as a Marchand Balun, which may be useful in a variety of systems including impedance matching systems, combiner/divider systems, double-balanced mixers and/or more advanced systems.

Thus, there may be a need for an apparatus and/or processes which may maximize characteristic impedance, for example relative to a ground plane. There may also be a need for an apparatus and/or processes which may provide coaxial transverse electromagnetic field modes for substantial isolation from a coaxial conductor to an external ground plane. There may also be a need for an apparatus and/or processes which employs multiple topologies in substantially the same in-plane location, and/or that employ multiple modes such as coaxial mode(s) and/or microstrip mode(s).

SUMMARY OF THE INVENTION

Embodiments relate to electric, electronic and/or electromagnetic devices, and/or processes thereof. Some embodiments relate to waveguide structures and/or processes thereof. In embodiments, for example, an apparatus may include one or more conductive surfaces, waveguide structures and/or ports forming and/or operating as a balun.

According to embodiments, an apparatus may include one or more conductive surfaces, waveguide structures and/or ports. In embodiments, one or more waveguide structures may include one or more portions disposed above a conductive surface and/or connected to one or more ports.

According to embodiments, one or more waveguide structures may include an outer conductor. In embodiments, an outer conductor of one or more waveguide structures may include a first portion connected to a conductive surface. In embodiments, an outer conductor of one or more waveguide structures may have a port end, which may include an elongated member. In embodiments, a portion of an outer conductor port and/or a portion of an elongated member may extend through a substrate to a portion of a conductive substrate. In embodiments, a port end may be connected to an outer conductor port. In embodiments, an outer conductor port may include a conductive surface surrounding at least a portion of an elongated member on two or more sides.

According to embodiments, one or more waveguide structures may include an inner conductor. In embodiments, an inner conductor may be disposed inside and/or spaced apart from an outer conductor. In embodiments, an inner conductor may be spaced apart from an outer conductor by a gas, for example air. In embodiments, an inner conductor may be spaced apart from an outer conductor by any suitable material, for example a dielectric material. In embodiments, an inner conductor of two or more waveguide structures may be connected with each other. In embodiments, an inner conductor of each of a plurality of waveguide structures may be connected to each other.

According to embodiments, one or more waveguide structures may be meandered. In embodiments, the cross-sectional area of one or more waveguide structures may change. In embodiments, the cross-sectional area of a portion of one or more outer conductors may change. In embodiments, the cross sectional area of a portion of one or more inner conductors may change. In embodiments, two or more waveguide structures may be located in a common plane that is substantially the same and/or is different relative to a conductive surface. In embodiments, the geometry of one or more waveguide structures may be determined to meet a predetermined electrical path length.

According to embodiments, an apparatus may include an inner conductor port. In embodiments, an inner conductor port may be connected to an inner conductor of one or more waveguide structures. In embodiments, an inner conductor port may be connected to an inner conductor of one or more waveguide structures at substantially the same region as a first portion of an outer conductor connected to a conductive surface.

According to embodiments, an apparatus may include a conductive surface. In embodiments, a conductive surface may be a ground plane. In embodiments, a conductive surface may have one or more aperture portions. In embodiments, one or more aperture portions may be aligned with one or more waveguide structures. In embodiments, one or more aperture portions may have a width substantially similar to the width of one or more waveguide structures. In embodiments, there may be a gas disposed between one or more aperture portions and one or more waveguide structures, for example air between a portion of one or more aperture portions and a portion of an outer conductor of one or more waveguide structures.

According to embodiments, one or more substrates may be disposed between one or more waveguide structures and a conductive surface. In embodiments, one or more substrates may be disposed between one or more waveguide structures and a conductive surface for a substantial portion of one or more waveguide structures. In embodiments, a substantial portion may be greater than approximately 25 percent of one or more waveguide structures. In embodiments, a substrate may include one or more vias. In embodiments, a substrate may include any suitable electrically insulative material, for example a ceramic, aluminum oxide, aluminum nitride, beryllium oxide, diamond, silicon carbide, silicon, sapphire, quartz and/or PTFE. In embodiments, a substrate may be thermally conductive.

A process of manufacturing an apparatus may include forming one or more conductive surfaces, waveguide structures and/or ports in accordance with aspects of embodiments. According to embodiments, a process of manufacturing an apparatus may include forming a portion of one or more conductive surfaces, waveguide structures and/or ports through any suitable process, for example a multi-layer sequential build, lamination, pick-and-place, transfer-bonding, deposition and/or electroplating process.

A circuit may include an apparatus having one or more conductive surfaces, waveguide structures and/or ports in accordance with aspects of embodiment, interconnected with one or more electrical circuits. According to embodiments, one or more electrical circuits may include an unbalanced electrical circuit, a balanced electrical circuit, a differential electrical circuit, an antenna and/or a powered device. In embodiments, for example, an unbalanced electrical circuit may be connected to an inner conductor port of one waveguide structure and/or a balanced electrical circuit may be connected to an outer conductor port of two waveguide structures.

BRIEF DESCRIPTION OF THE DRAWINGS

Example

Example FIG. 2A to FIG. 2D illustrates a cross-section of an apparatus in accordance with one aspect of embodiments.

Figure 3:
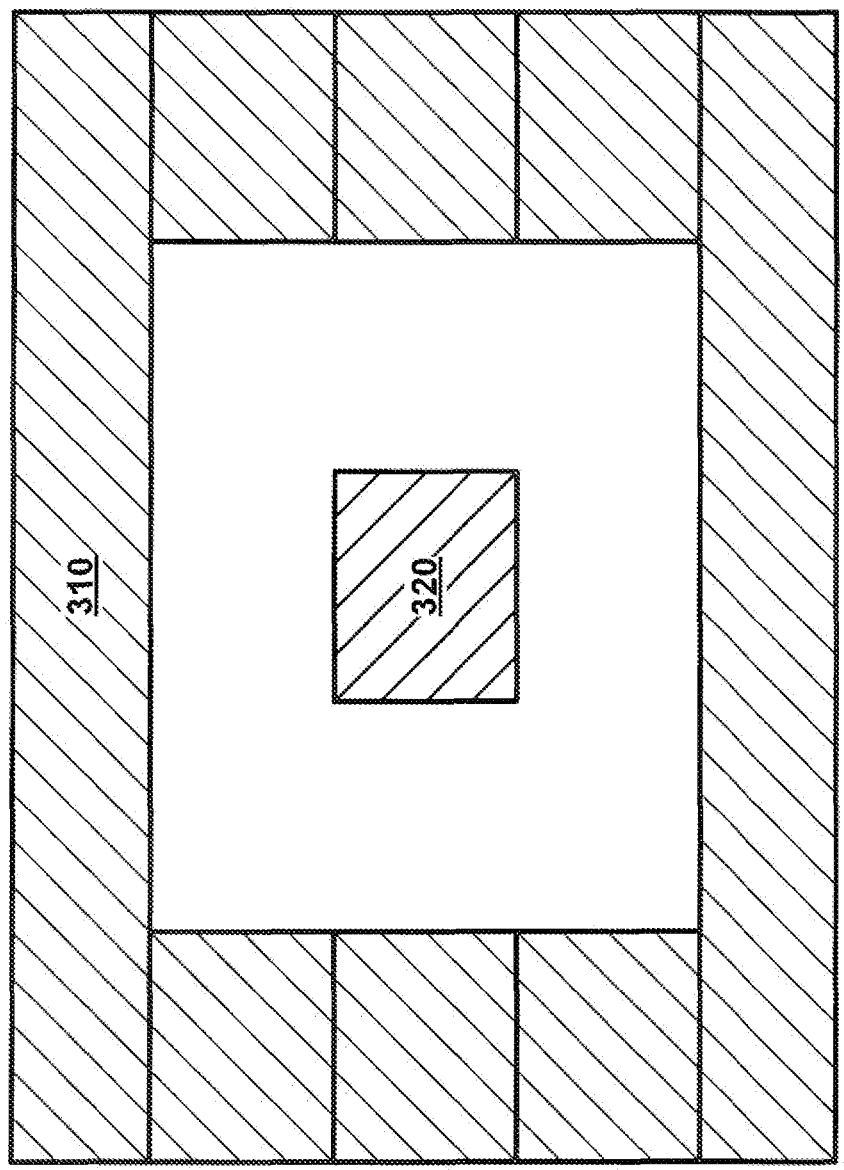

Example FIG. 3 illustrates a cross-section of an apparatus in accordance with one aspect of embodiments.

Figure 4:
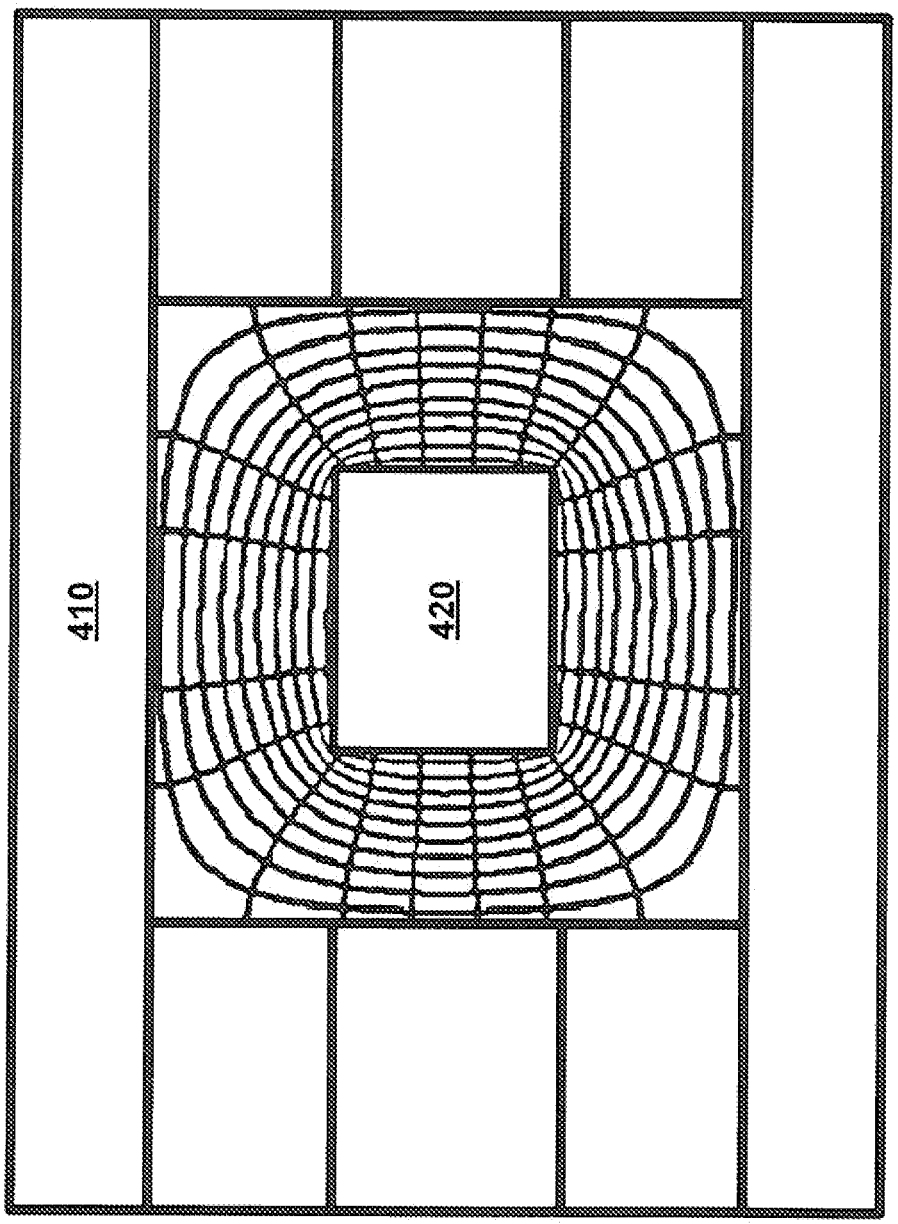

Example FIG. 4 illustrates a cross-section and a mode in accordance with one aspect of embodiments.

Figure 5:
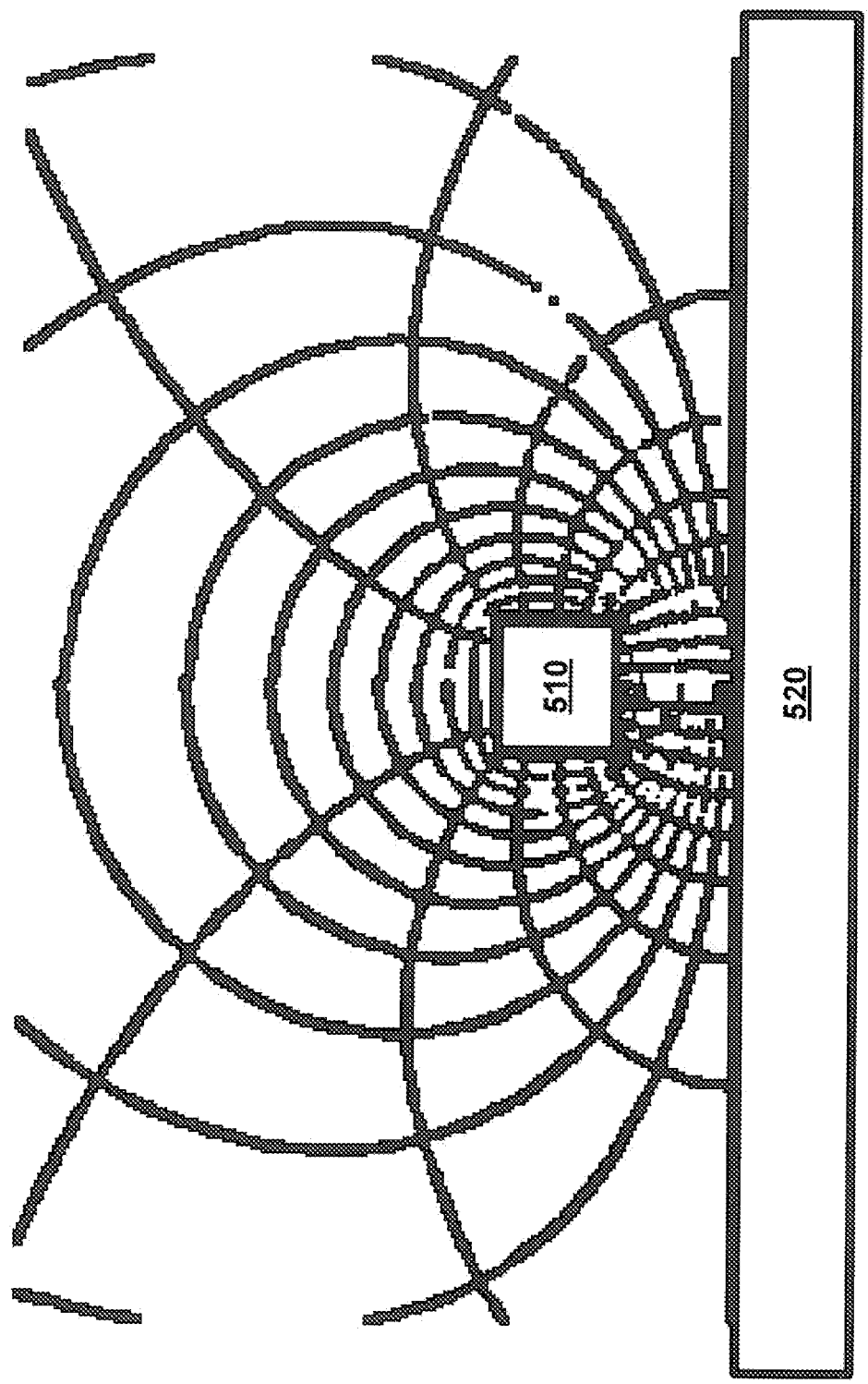

Example FIG. 5 illustrates a cross section and a mode in accordance with one aspect of embodiments.

Figure 6:
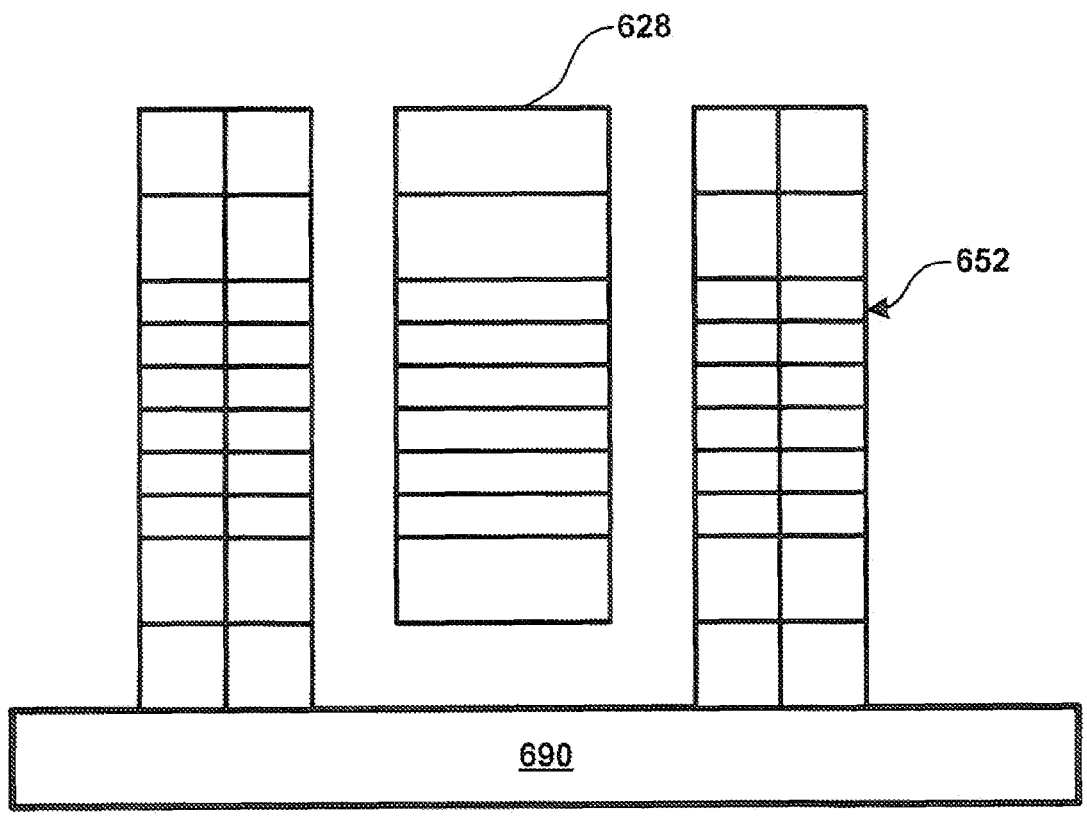

Example FIG. 6 illustrates a cross-section of an output port in accordance with one aspect of embodiments.

Figure 7:
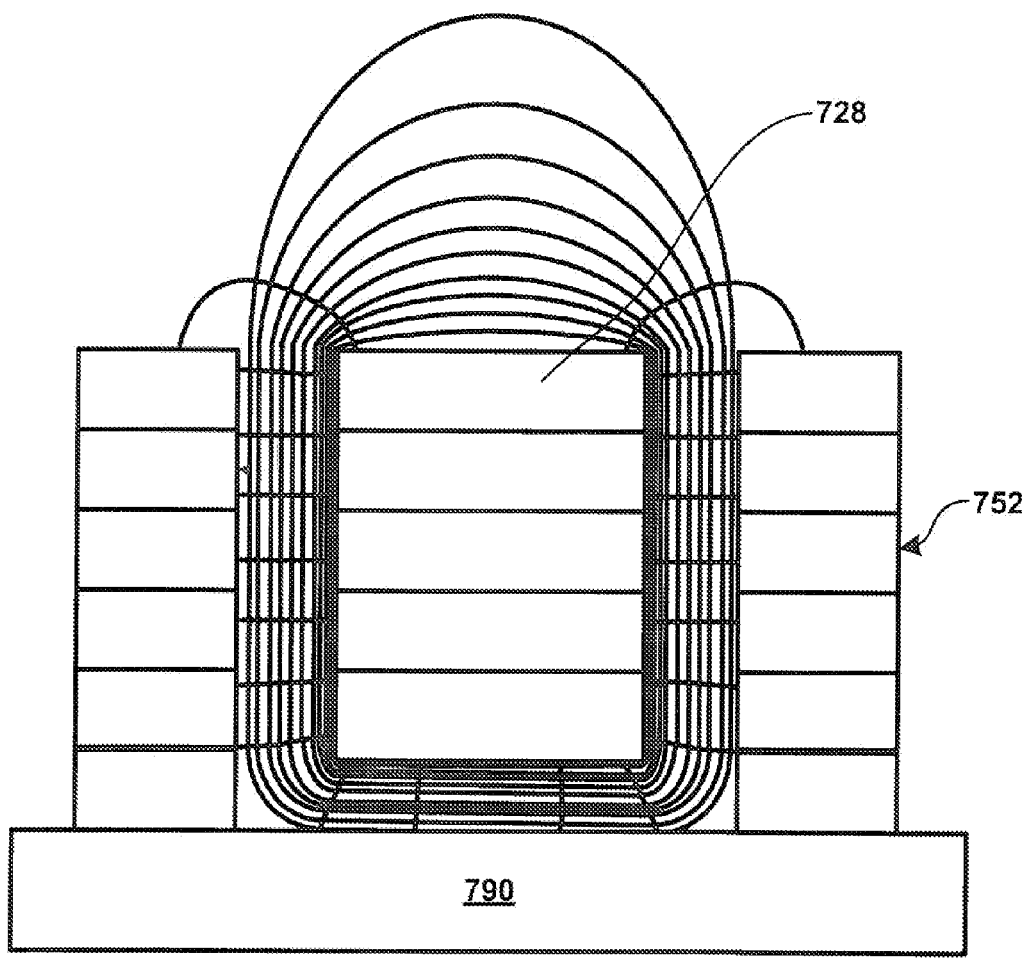

Example FIG. 7 illustrates a cross-section of an output port and a mode in accordance with one aspect of embodiments.

Example FIG. 8A to FIG. 8D illustrates a cross-section of an apparatus in accordance with one aspect of embodiments.

Figure 9A:
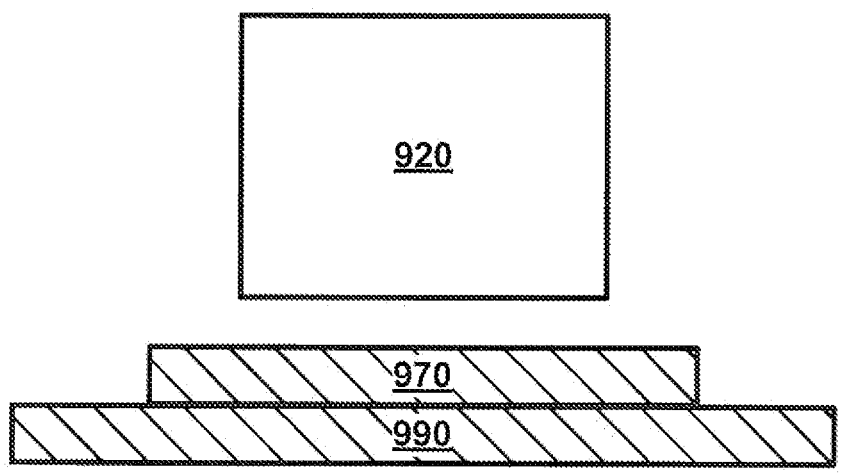
Figure 9B:
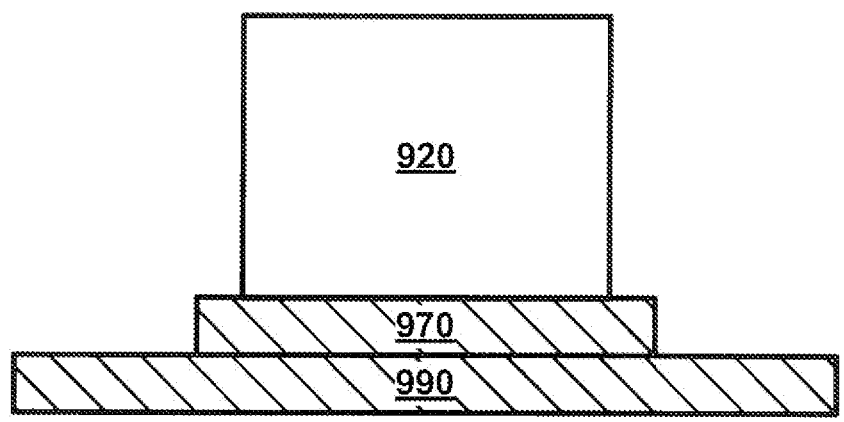
Figure 9C:
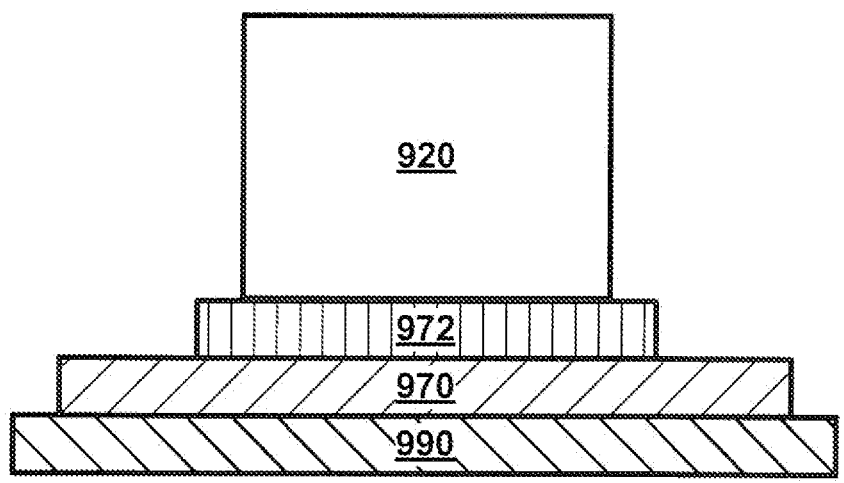

Example FIG. 9A to FIG. 9C illustrates a cross-section of an apparatus in accordance with one aspect of embodiments.

Figure 10B:
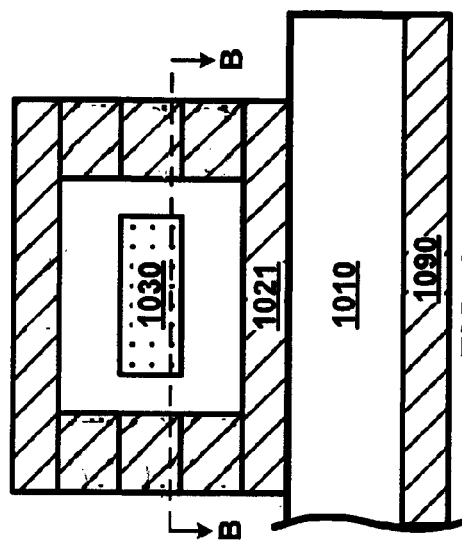
Figure 10A:
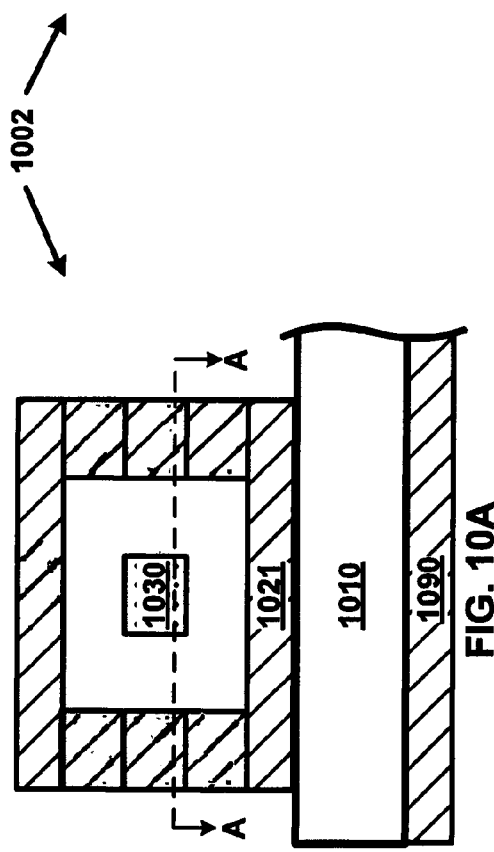
Figure 10C:
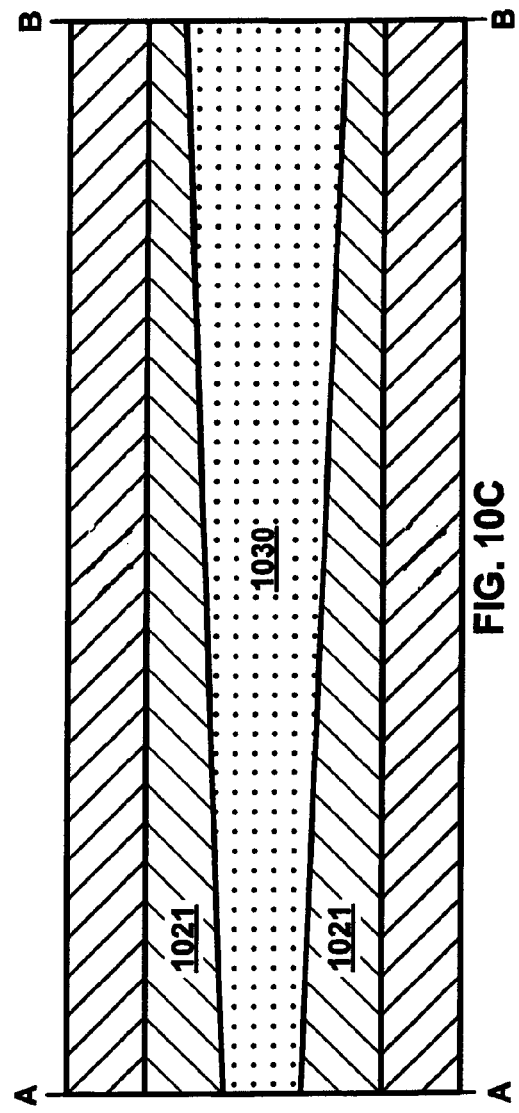

Example FIG. 10A to FIG. 10C illustrates a cross-section of an apparatus in accordance with one aspect of embodiments.

Figure 11:
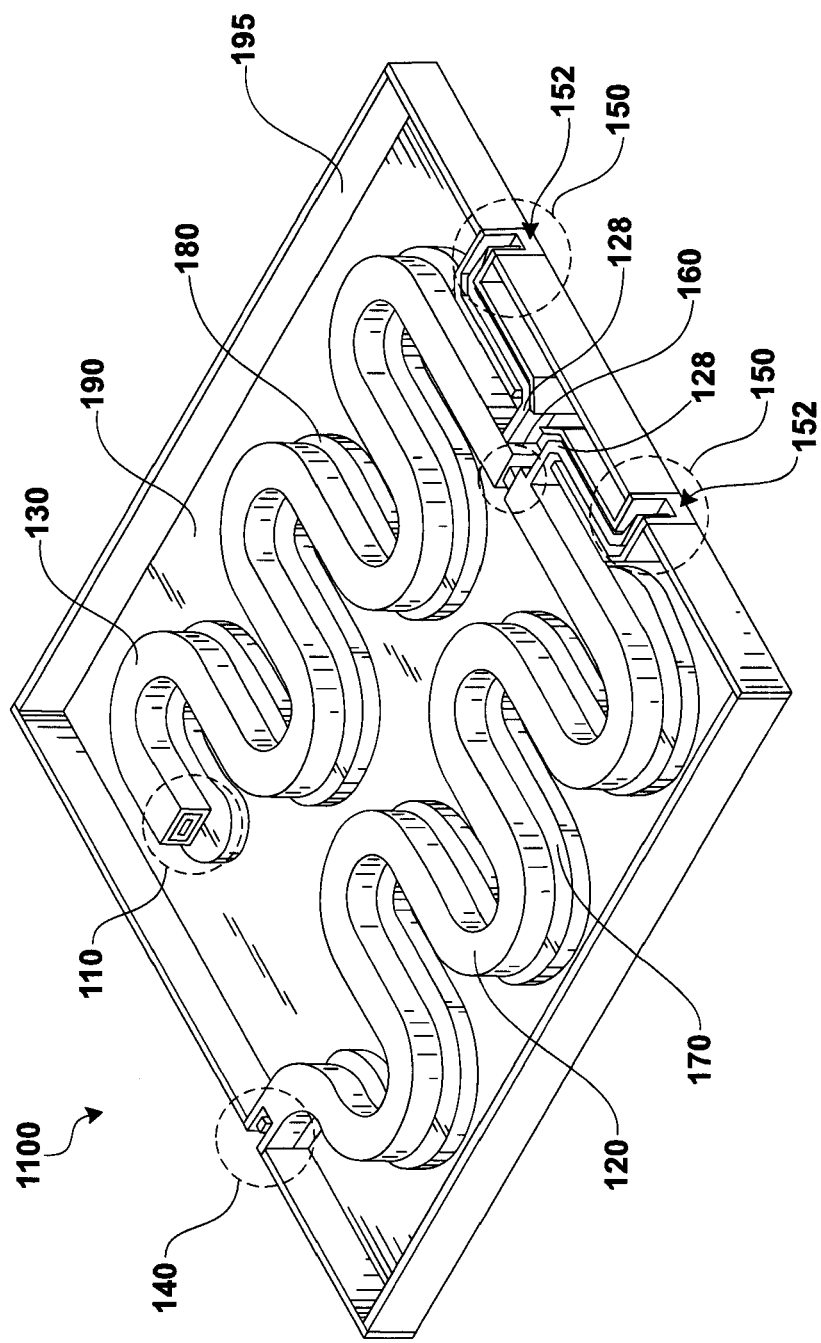

Example FIG. 11 illustrates a plan view of an apparatus in accordance with one aspect of embodiments.

Figure 12:
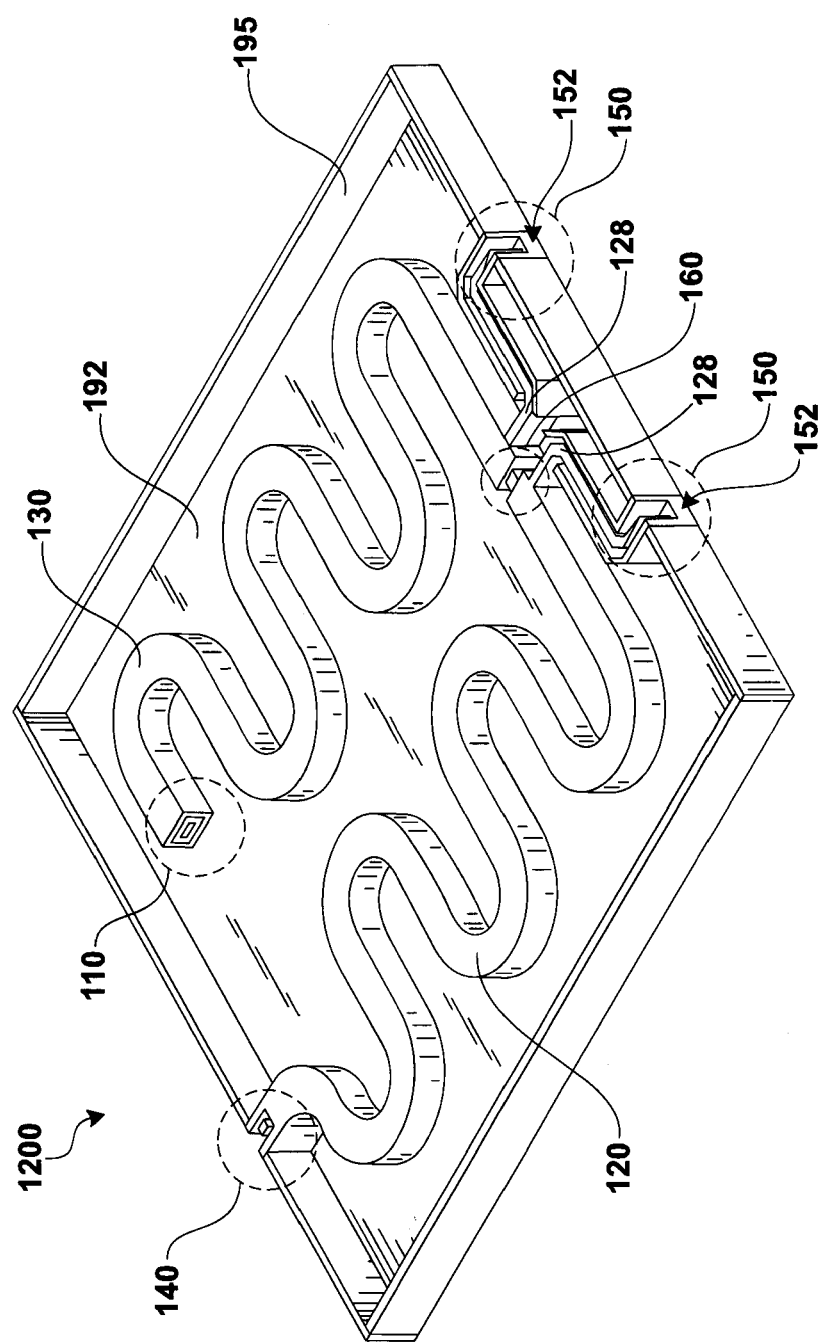

Example FIG. 12 illustrates a plan view of an apparatus in accordance with one aspect of embodiments.

Figure 13:
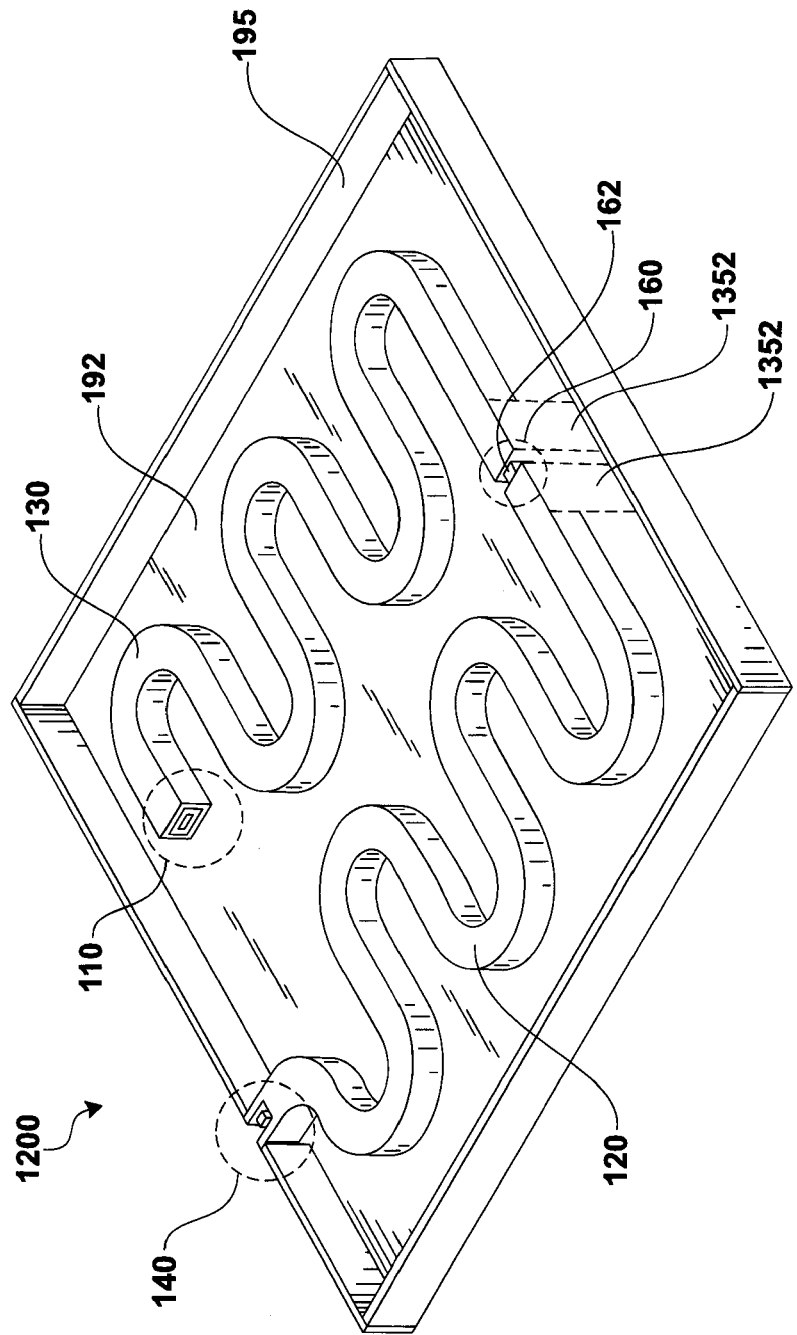

Example FIG. 13 illustrates a plan view of an apparatus in accordance with one aspect of embodiments.

Figure 14:
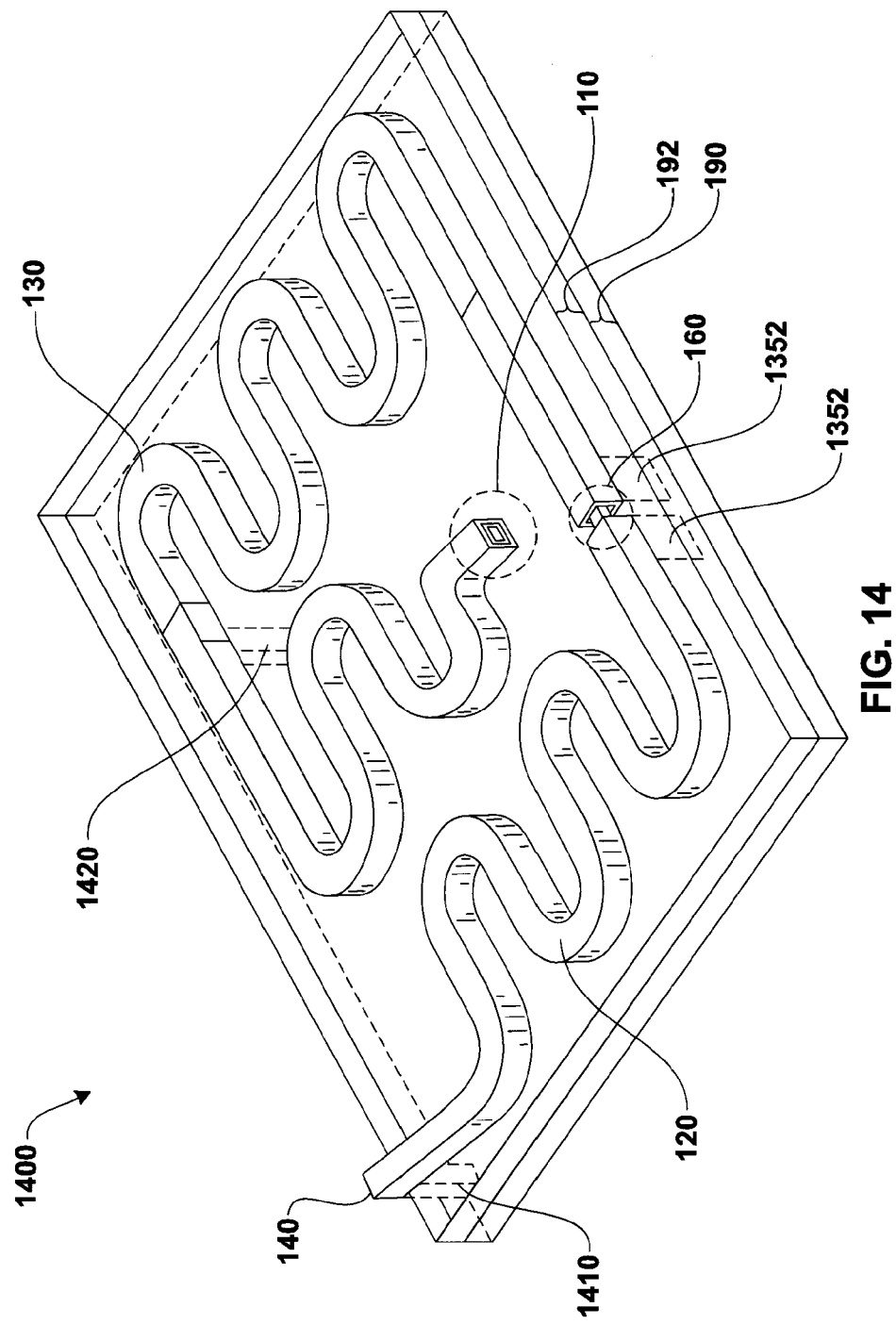

Example FIG. 14 illustrates a plan view of an apparatus in accordance with one aspect of embodiments.

DETAILED DESCRIPTION OF THE INVENTION

Embodiments relate to electric, electronic and/or electromagnetic devices, and/or processes thereof. Some embodiments relate to waveguide structures and/or processes thereof. In embodiments, for example, an apparatus may include one or more conductive surfaces, waveguide structures and/or ports forming and/or operating as a balun.

Embodiments relate to an apparatus. According to embodiments, an apparatus may include one or more conductive surfaces, waveguide structures and/or ports. In embodiments, any suitable shape may be employed for any portion of an apparatus. In embodiments, for example, one or more waveguide structures may be meandered, substantially straight and/or any other desired shape. In embodiments, for example, an outer conductor and/or inner conductor of one or more waveguide structures may include a rectangular, circular, and/or square shape and/or any other desired shape. In embodiments, for example, an inner conductor port and/or an outer conductor port may include a U-shape, Z-shape, V-shape and/or any other desired shape. In embodiments, a conductive surface may be substantially planar and/or any other desired shape.

Figure 1:
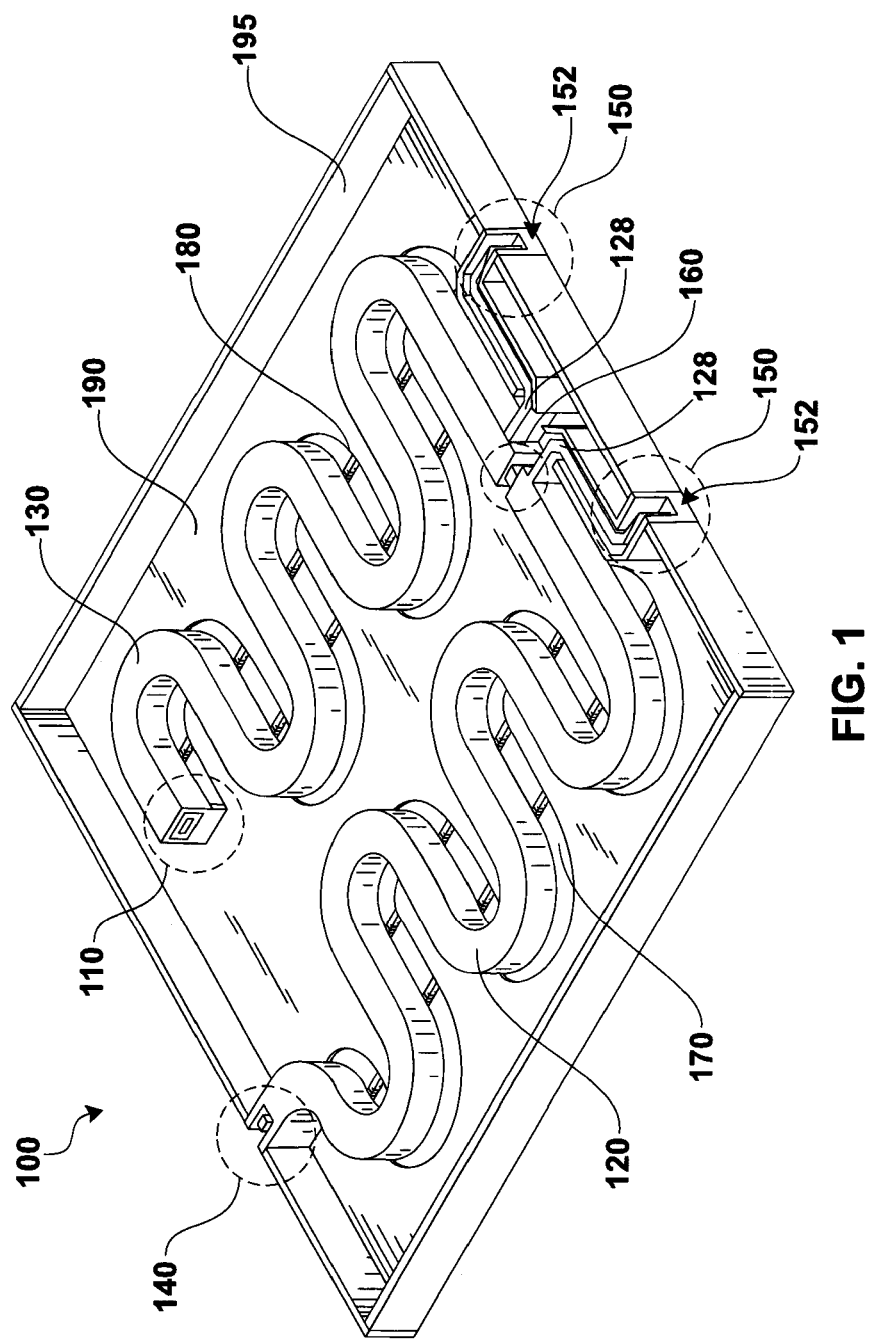
FIG. 1 illustrates a plan view of an apparatus in accordance with one aspect of embodiments.

Referring to example FIG. 1 of the figures, wherein like elements are numbered alike throughout, an apparatus in accordance with one aspect of embodiments is illustrated. In embodiments, apparatus 100 may include two waveguide structures 120, 130. In embodiments, one or more waveguide structures may include one or more portions disposed above a conductive surface. As illustrated in one aspect of embodiments, waveguide structure 120 may include a portion disposed above conductive surface 190 extending between area 140 and 160. In embodiments, one or more waveguide structures may be connected to one or more ports. As illustrated in one aspect of embodiments, waveguide structure 120 is connected to a port at area 140 and waveguide structures 120, 130 are connected to ports at areas 150, respectively.

According to embodiments; one or more waveguide structures may have any suitable configuration, for example including a portion having a configuration as illustrated in U.S. Pat. Nos. 7,012,489, 7,649,432 and/or 7,656,256, each of which are incorporated by reference herein in their entireties. In embodiments, one or more waveguide structures may include an outer conductor. In embodiments, an outer conductor may include any suitable non-insulative and/or electrically conductive material, for example metal, metal alloy and/or semiconductor material. In embodiments, one or more waveguide structures may include one or more support members formed of insulative material, for example to support an inner conductor.

Figure 2A:
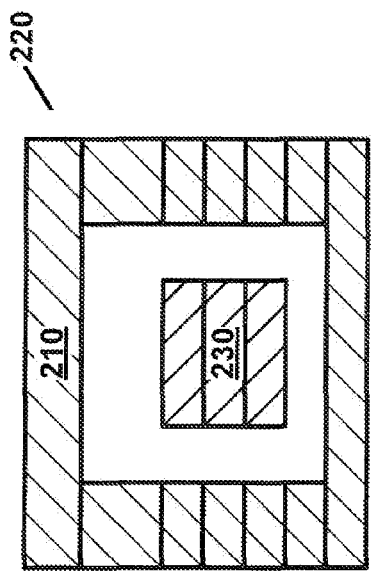
Figure 2B:
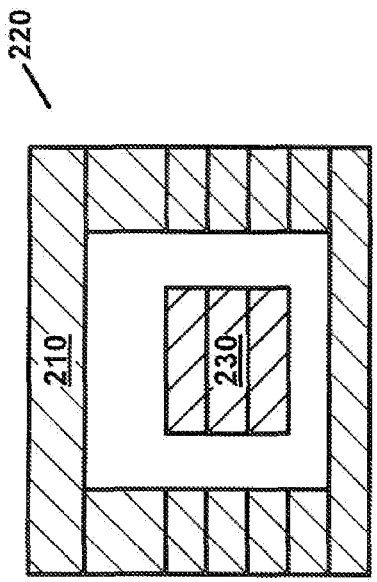
Figure 2C:
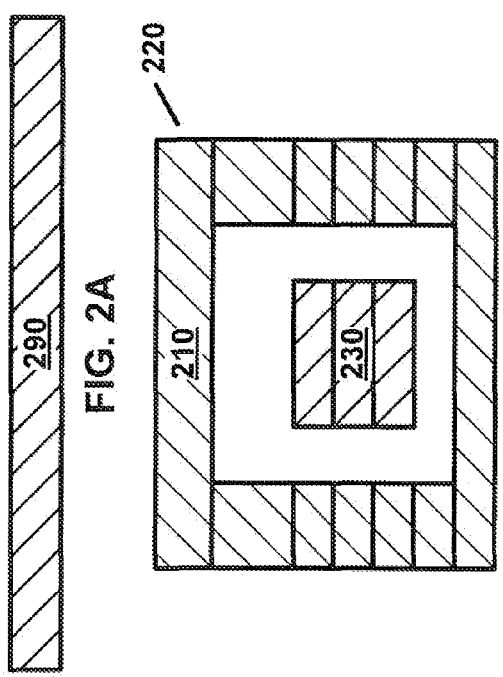

Referring to example FIGS. 2A-2D, one or more waveguide structures 220 may include outer conductor 210 (FIGS. 2A-2C). According to embodiments, an outer conductor of one or more waveguide structures may include a first portion connected to a conductive surface 290. Referring back to FIG. 1, an outer conductor of waveguide structures 120, 130 may include a first portion connected to a conductive substrate at areas 140, 110, respectively. In embodiments, a connection may be made by any suitable process, including using heat, pressure and/or epoxy to solder, deposit and/or bond one or more waveguide structures with a conductive surface.

According to embodiments, an outer conductor of one or more waveguide structures may have a port end, which may include an elongated member. As illustrated in one aspect of embodiments at FIG. 1, waveguide structures 120, 130 may have port ends including elongated probes or members having a tapered end 128. In embodiments, a port end may be connected to an outer conductor port. In embodiments, a portion of an elongated member of an outer conductor and/or a portion of an outer conductor port may extend through a substrate to a portion of a conductive surface. As illustrated in one aspect of embodiments at FIG. 13, waveguide structures 120, 130 may have port ends connected to outer conductor ports 1352 extending through non-conductive substrate 192 to a portion of a conductive surface. An inner conductor of two wave guide structures may be connected with each other at a location 162.

According to embodiments, an outer conductor port may include a conductive surface surrounding at least a portion of an elongated member on two or more sides. Referring back to FIG. 1, outer conductor ports 152 may include conductive surface 190 surrounding a portion of elongated member 128 on three sides. An apparatus including an outer conductor port having a conductive surface surrounding a portion of an elongated member is illustrated in one aspect of embodiments at example FIG. 6.

According to embodiments, one or more waveguide structures may include an inner conductor. In embodiments, an inner conductor may include any suitable non-insulative and/or electrically conductive material, for example metal, metal alloy and/or semiconductor material. In embodiments, an inner conductor may be disposed inside and/or spaced apart from an outer conductor. Referring back to FIGS. 2A-2C, inner conductor 230 may be spaced apart from outer conductor 210 by a gas, for example air. In embodiments, an inner conductor may be spaced apart from an outer conductor by any suitable material, for example a dielectric material. In embodiments, inner conductor may be disposed and/or spaced apart from an outer conductor in vacuum.

According to embodiments, an inner conductor of two or more waveguide structures may be connected with each other. Referring back to FIG. 1, inner conductor of waveguide structure 120 and inner conductor of waveguide structure 130 may be connected with each other at area 160. In embodiments, an inner conductor of each of a plurality of waveguide structures, for example three or more waveguide structures, may be connected to each other. In embodiments, one or more waveguide structures may be meandered, as illustrated in one aspect of embodiments at FIG. 1.

According to embodiments, the cross-sectional area of one or more waveguide structures may change. Referring to example FIG. 10A to FIG. 10C, an apparatus is illustrated in accordance with one aspect of embodiments. In embodiments, the cross-sectional area of a portion of one or more outer conductors may change. In embodiments, the cross-sectional area of a portion of one or more inner conductors may change. As illustrated in one aspect of embodiments at FIG. 10C, the cross-sectional area of a portion inner conductor 1030 may change in such a way as to show less of outer conductor portion 1021 moving in a direction from A to B. In embodiments, a change may be any suitable change, for example a gradual change such as a tapered change and/or a discontinuous change such as a stepped change.

According to embodiments, the in-plane location of two or more waveguide structures may be substantially the same and/or be different relative to a conductive surface. Referring back to FIG. 1, waveguide structures 120, 130 may be located in a common plane that is substantially the same relative to conductive surface 190. In embodiments, the in-plane location may be different, for example partially overlapped, such as in a crossing configuration and/or as in a parallel and out of register configuration, and/or substantially completely out of register relative to a conductive surface. In embodiments, the geometry of one or more waveguide structures may be determined to meet a predetermined electrical path length.

According to embodiments, an apparatus may include an inner conductor port. In embodiments, an inner conductor port may be connected to an inner conductor of one or more waveguide structures. In embodiments, an inner conductor port may be connected to an inner conductor of one or more waveguide structures at substantially the same region as a first portion of an outer conductor connected to a conductive surface. As illustrated in one aspect of embodiments at FIG. 1, apparatus 100 may include an inner conductor port at area 140 connected to an inner conductor of waveguide structure 120, which is substantially the same region where a first portion of an outer conductor of waveguide structure 120 is connected to conductive surface 190. In embodiments, an outer conductor port, an inner conductor port, an outer conductor and/or an inner conductor may be any suitable geometry to form a permanent and/or repeatable releasable connection between an apparatus in accordance with embodiments and any electrical circuit and/or device.

According to embodiments, an apparatus may include a conductive surface. In embodiments, a conductive surface may include any suitable non-insulative and/or electrically conductive material, for example metal, metal alloy and/or semiconductor material. In embodiments, a conductive surface may be formed of the same and/or similar material as one or more waveguide structures. In embodiments, a conductive surface may be a ground plane.

According to embodiments, a conductive surface may have one or more aperture portions. As illustrated in one aspect of embodiments at FIG. 1, apparatus 100 may include conductive surface 190 having aperture portions 170. In embodiments, one or more aperture portions may be aligned with one or more waveguide structures. In embodiments, one or more aperture portions may have a width substantially similar to the width of one or more waveguide structures. In embodiments, there may be a gas disposed between one or more aperture portions and one or more waveguide structures, for example air between a portion of one or more aperture portions and a portion of an outer conductor of one or more waveguide structures. As illustrated in one aspect of embodiments at FIG. 1, aperture portions 170 may be aligned with waveguide structure 120, 130, respectively, have a width substantially similar to the width of waveguide structures 120, 130, respectively, and/or have a gas such as air disposed there-between.

According to embodiments, a part of one or more aperture portions 170 may include one or more cross members 180. In embodiments, one or more cross members 180 may connect conductive surface 190 across one or more aperture portions 170. In embodiments, one or more cross members may be formed of conductive material. In embodiments, one or more cross members may be formed of substantially the same material as a conductive surface and/or may be formed at substantially the same time as a conductive surface.

According to embodiments, a portion of an apparatus may be at a ground potential, for example conductive surface 190. In embodiments, a portion of an apparatus may be kept at substantially the same potential, for example using periodic monolithically fabricated conductive cross members between two sides of one or more apertures, minimizing electric potential that may otherwise be substantially different. In embodiments, any suitable structure may be employed to enable substantially the same electrical potential between two sides of one or more apertures. In embodiments, removing a portion of a conductive surface next to a signal conductor may provide a maximized characteristic impedance, which may increases bandwidth of a device.

Figure 8A:
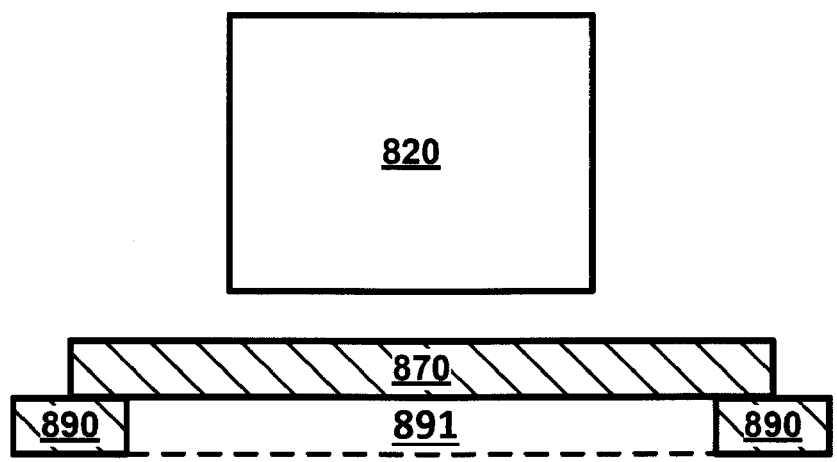
Figure 8B:
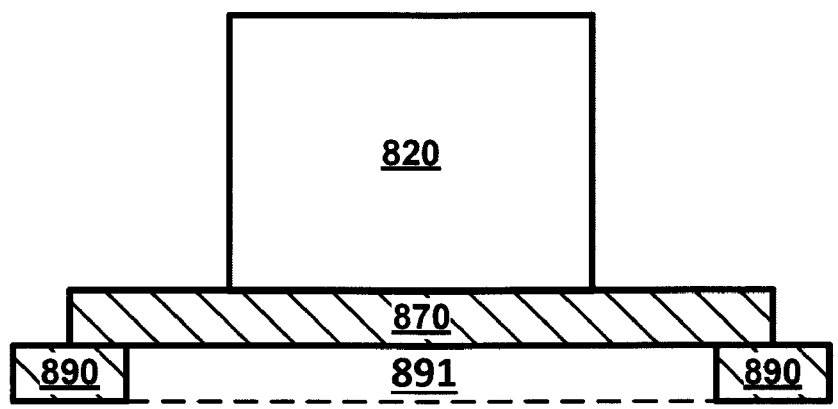
Figure 8C:
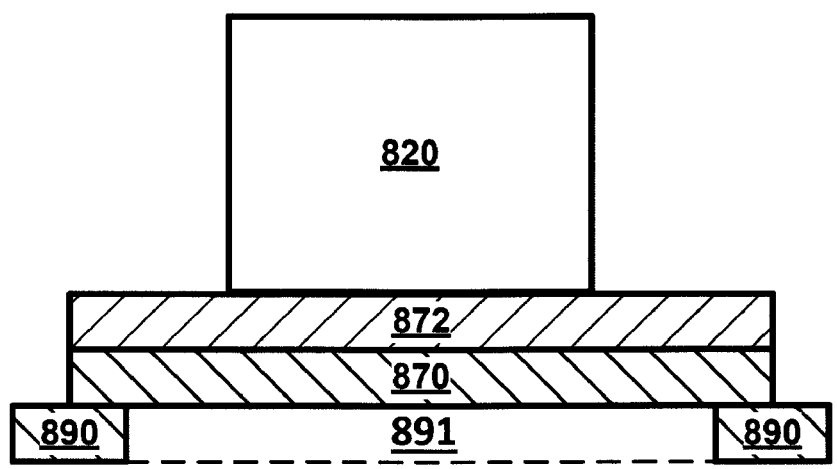
Figure 8D:
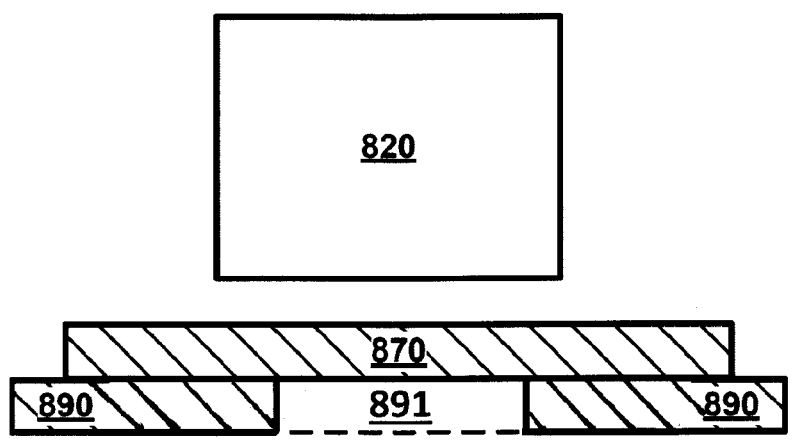

According to embodiments, one or more substrates may be disposed between one or more waveguide structures and a conductive surface. As illustrated in FIG. 8A and FIG. 8D, an apparatus may include conductive surface 890 having an aperture portion 891 aligned with waveguide structure 820, and including a gas and/or substrate 870 disposed between waveguide structure 820 and conductive surface 890. As illustrated at FIG. 8B, an apparatus may include conductive surface 890 having an aperture portion 891 aligned with waveguide structure 820, and including substrate 870 disposed between waveguide structure 820 and conductive surface 890. As illustrated at FIG. 8C, an apparatus may include conductive surface 890 having an aperture portion 891 aligned with waveguide structure 820, and including a multitude of substrates, for example 870, 872, disposed between waveguide structure 820 and conductive surface 890.

Referring to example FIG. 9A to FIG. 9B, an apparatus is illustrated in accordance with embodiments. As illustrated in one aspect of embodiments at FIG. 9A, an apparatus may include a portion of waveguide structure 920 disposed above conductive surface 990 including a gas and/or substrate 970 disposed between waveguide structure 920 and conductive surface 990. As illustrated at FIG. 9B, an apparatus may include a portion of waveguide structure 920 disposed above conductive surface 990 including substrate 970 disposed between waveguide structure 920 and conductive surface 990. As illustrated at FIG. 9C, an apparatus may include a portion of waveguide structure 920 disposed above conductive surface 990 including a multitude of substrates, for example 970, 972, disposed between waveguide structure 920 and conductive surface 990. As illustrated at FIG. 10A and FIG. 10B, an apparatus may include a portion of waveguide structure 1002 disposed above conductive surface 1090 including substrate 1010 disposed between waveguide structure 1002 and conductive surface 1090. In embodiments, a substrate 1010 may include any suitable electrically insulative material, for example a ceramic, aluminum nitride, alumina, beryllium oxide, silicon, sapphire, quartz and/or PTFE.

According to embodiments, one or more substrates may be disposed between one or more waveguide structures and a conductive surface for a substantial portion of one or more waveguide structures. As illustrated in an aspect of embodiments at example FIG. 11, apparatus 1100 may include substrates 170, 180 disposed between waveguide structures 120, 130 and conductive surface 190, respectively. In embodiments, substrates 170, 180 may have one or more dimensions substantially similar to waveguide structures 179, 180, for example width, length and/or height. As illustrated in an aspect of embodiments at example FIG. 12, apparatus 1200 may include substrate 192 disposed between waveguide structures 120, 130 and a conductive surface, respectively. In embodiments, substrate 192 may be in the form of a layer that covers substantially all of a conductive surface.

According to embodiments, a substrate may include one or more vias. As illustrated in one aspect of embodiments at FIG. 14, an elongated member may not be employed to form outer conductor ports 1352. In embodiment, outer conductor ports 1352 may be constructed directly between conductive surface 190 and the ends of outer conductors of waveguide structures 120 and 130, for example proximate region 160. In embodiments, apparatus 1400 may include substrate 192 having one or more vias, for example aligned with outer conductor ports 1352.

According to embodiments, a connection between a first portion of one or more waveguide structures and a conductive surface may be at any suitable location of an apparatus. As illustrated at FIG. 14, substrate 192 may have one or more vias to enable a first portion of waveguide structure 120 to be connected to conductive surface 190, for example using conductive material 1410. As illustrated at FIG. 14, substrate 192 may have one or more vias to enable a first portion of waveguide structure 130 to be connected to conductive surface 190, for example using conductive material 1420.

Embodiments relate to an apparatus, and/or a method thereof, implementing one or more waveguide structures configured to provide a guided mode, for example a balun and/or an impedance transformer. In embodiments, for example, a guided mode may include at least one coaxial guided mode and/or at least one microstrip mode. In embodiments, for example, a microstrip mode may be guided in a substrate next to a coax structure.

According to embodiments, multiple transmission line topologies may be employed, for example microstrip, coplanar waveguide, modified microstrip, modified co-planar waveguide and/or rectangular coax topologies. In embodiments, topologies may employ structures that may provide functionality for multiple transmission line modes. As illustrated in one aspect of embodiments at FIG. 2A-2D, a coaxial line may be formed over a conductive surface where a coaxial mode exists between an inner conductor and an outer conductor of a coax line, and a second mode may exist between an outer conductor of a coax line and a conductive surface.

Figure 2D:
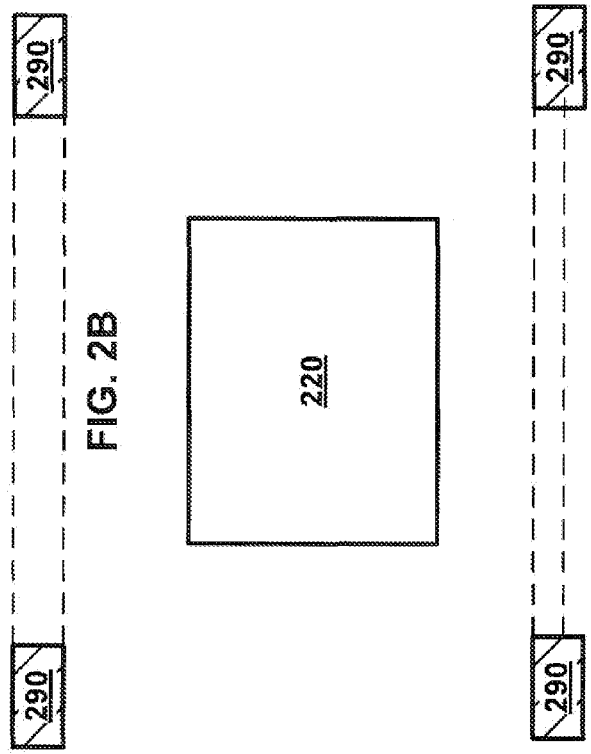

Referring to FIG. 2A, a device operating in a coaxial mode and/or a microstrip mode is illustrated in accordance with one aspect of embodiments. Referring to FIG. 2B, a device operating in a coaxial mode and a modified microstrip mode is illustrated in accordance with one aspect of embodiments. Referring to FIG. 2C, a device operating in a coaxial mode is illustrated in accordance with one aspect of embodiments. Referring to FIG. 2D, a device operating in a modified co-planar waveguide mode is illustrated in accordance with one aspect of embodiments.

Referring to example FIG. 3, a coaxial waveguide microstructure is illustrated in accordance with one aspect of embodiments, having an outer conductor 310 and inner conductor 320. Referring to example FIG. 4, a mode pattern is illustrated for a transverse electromagnetic wave propagating in a rectangular coaxial cross section. In embodiments, the electric field vectors may originate on inner conductor 420 and travel to outer conductor 410. In embodiments, the equi-potential lines for the electric field may be normal to the electric field vectors and/or encircle inner conductor 420.

Referring to example FIG. 5, a mode pattern is illustrated for a transverse electromagnetic wave propagating in a rectangular coaxial cross section in accordance with one aspect of embodiments. In embodiments, the electric field vectors may originate on a signal conductor of waveguide structure 510 and travel to a conductive surface 520. In embodiments, the equi-potential lines for the electric field may be normal to the electric field vectors and/or encircle a signal conductor of waveguide structure 510. In embodiments, a mixed-dielectric structure with a signal conductor and a conductive surface separated by a dielectric substrate may be used with similar effects.

Referring to example FIG. 6, the cross section of a waveguide structure having a U-shaped conductive surface is illustrated in accordance with one aspect of embodiments. According to embodiments, outer conductor port 652 may include conductive surface 690 surrounding a portion of elongated member 628 on two or more sides. In embodiments, a conductive surface (e.g., U-shaped conductive surface) together with a signal conductor (e.g., an elongated member) may provide an input and/or an output port, for example near the edge of an apparatus. Referring to example FIG. 7, a mode pattern is illustrated for a transverse electromagnetic wave propagating in a modified microstrip mode in accordance with one aspect of embodiments. In embodiments, the electric field vectors may originate on signal conductor 728 and travel to a U-shaped conductive surface 790 surrounding it on three sides to form outer conductor port 752. In embodiments, the equi-potential lines for the electric field may be normal to the electric field vectors and/or encircle a signal conductor.

Referring back to FIG. 1, waveguide structure 120 may exhibit an impedance Za. According to embodiments, waveguide structure 130 may exhibit an impedance Zb. In embodiments, the outside of the outer conductor of waveguide structure 120 and the conductive surface 190 may exhibit an impedance Zab. In embodiments, the outside of the outer conductor of waveguide structure 130 and the conductive surface 190 may exhibit an impedance which may be substantially the same as impedance Zab. In embodiments, the outer conductor port 152 may exhibit an impedance Zc, which may result from one or more of the geometry and/or location of elongated member 128, of outer conductor port 152, and/or of conductive surfaces 190 and/or 195.

Referring back to example FIG. 14, the electrical lengths of the transmission lines corresponding to Zb and the two Zab paths may be substantially the same. In embodiments, a dielectric constant in waveguide structure 130 may be different than outside of waveguide structure 130, and/or the physical lengths of the lines corresponding to Zab under both the Za and Zb lines may be all different. In embodiments, maximizing the effective dielectric constant of the Zab propagation modes may minimize the physical length of the Zab transmission lines, which may reduce the overall size of the apparatus. In embodiments, the electrical length of waveguide structure 130 and the Zab transmission line paths may be made substantially the same, for example by shorting the outer conductor of waveguide structure 130 to conductive surface 190 using conductive material 1420. In embodiments, the dissipative loss running through a device may be minimized when the effective dielectric constant inside waveguide structure 120 and 130 are minimized.

Embodiments relate to a process of manufacturing an apparatus. According to embodiments, a process of manufacturing an apparatus may include forming one or more conductive surfaces, waveguide structures and/or ports in accordance with aspects of embodiments. According to embodiments, a process of manufacturing an apparatus may include forming a portion of one or more conductive surfaces, waveguide structures and/or ports through any suitable process, for example a lamination, pick-and-place, transfer-bonding, deposition and/or electroplating process. Such processes may be illustrated at least at U.S. Pat. Nos. 7,012,489, 7,129,163, 7,649,432, 7,656,256, and/or U.S. patent application Ser. No. 12/953,393, each of which are incorporated by reference herein in their entireties. According to embodiments, for example, one or more openings of a substrate may be formed using any suitable process, for example as illustrated in U.S. Pat. No. 7,129,163. In embodiments, for example, one or more vias may be formed using etching processes, for example dry and/or wet etching. In embodiments, one or more openings may be filled with conductive material, and/or one or more walls of one or more openings may be partially and/or substantially covered by conductive material which makes electrical continuity from the front to the back side of the substrate through said one or more openings. In embodiments, one or more waveguide structures may be formed over a substrate including one or more vias after the vias are formed.

According to embodiments, for example, a sequential build process including one or more material integration processes may be employed to form a portion and/or substantially all of an apparatus. In embodiments, a sequential build process may be accomplished through processes including various combinations of: (a) metal material, sacrificial material (e.g., photoresist), insulative material (e.g., dielectric) and/or thermally conductive material deposition processes; (b) surface planarization; (c) photolithography; and/or (d) etching or other layer removal processes. In embodiments, plating techniques may be useful, although other deposition techniques such as physical vapor deposition (PVD) and/or chemical vapor deposition (CVD) techniques may be employed.

According to embodiments, a sequential build process may include disposing a plurality of layers over a substrate. In embodiments, layers may include one or more layers of a dielectric material, one or more layers of a metal material and/or one or more layers of a resist material. In embodiments, a first microstructural element such as a support member may be formed of dielectric material. In embodiments, a support structure may include an anchoring portion, such as an aperture extending at least partially there-through. In embodiments, a second microstructural element, such as an inner conductor and/or an outer conductor, may be formed of a metal material. In embodiments, one or more layers may be etched by any suitable process, for example wet and/or dry etching processes.

According to embodiments, a metal material may be deposited in an aperture of a first microstructural element, affixing a first microstructural element to a second microstructural element. In embodiments, for example when an anchoring portion includes a re-entrant profile, a first microstructural element may be affixed to a second microstructural element by forming a layer of a second microstructural element on a layer of a first microstructural element. In embodiments, sacrificial material may be removed to form a non-solid volume, which may be occupied by a gas such as air or sulfur hexafluoride, vacuous or a liquid, and/or to which a first microstructural element, second microstructural element and/or thermal member may be exposed. In embodiments, a non-solid volume may be filled with dielectric material, and/or insulative may be disposed between any one of a first microstructural element, a second microstructural element and/or a thermal manager.

According to embodiments, for example, a sequential build process may include depositing one or more layers of thermally conductive materials. In embodiments, one or more layers of thermally conductive material may be deposited at any desired location, for example at substantially the same in-plane location as a layer of a first microstructural element and/or second microstructural element. In embodiments, one or more layers of thermally conductive material may be deposited at any desired location, for example spaced apart from one or more layers of a first microstructural element and/or second microstructural element.

According to embodiments, for example, any material integration process may be employed to form a part and/or all of an apparatus. In embodiments, for example, transfer bonding, lamination, pick-and-place, deposition transfer (e.g., slurry transfer), and/or electroplating on and/or over a substrate layer, which may be mid-build of a process flow, may be employed. In embodiments, a transfer bonding process may include affixing a first material to a carrier substrate, patterning a material, affixing a patterned material to a substrate, and/or releasing a carrier substrate. In embodiments, a lamination process may include patterning a material before and/or after a material is laminated to a substrate layer and/or any other desired layer. In embodiments, a material may be supported by a support lattice to suspend it before it is laminated, and then it may be laminated to a layer. In embodiments, a material may be selectively dispensed. In embodiments, a material may include a layer of a material and/or a portion of an apparatus, for example pick-and-placing one or more waveguide structures on and/or over a conductive surface.

Embodiments relate to a circuit. According to embodiments, a circuit may include an apparatus having one or more conductive surfaces, waveguide structures and/or ports in accordance with aspects of embodiment, interconnected with one or more electrical circuits. According to embodiments, one or more electrical circuits may include an unbalanced electrical circuit, a balanced electrical circuit, a differential electrical circuit, an antenna and/or a powered device. In embodiments, for example, an unbalanced electrical circuit may be connected to an inner conductor port of one waveguide structure.

Referring back to FIG. 1, an unbalanced electrical circuit may be connected to an inner conductor port and/or an inner conductor at area 140. In embodiments, a balanced electrical circuit may be connected to outer conductor ports 152 and/or elongated members 128 of waveguide structures 120, 130. In embodiments, any desired configuration may be employed. In embodiments, for example, an unbalanced electrical circuit may be connected to an inner conductor port and/or an inner conductor at area 140 and/or two unbalanced electrical circuits may be connected to outer conductor ports 152 and/or elongated members 128 of waveguide structures 120, 130. In embodiments, any desired devices may be employed, for example antennas and/or powered devices. In embodiments, an apparatus may be useful in a variety of systems including impedance matching systems, combiner/divider systems, double-balanced mixer and/or more advanced systems.

Various modifications and variations can be made in the embodiments disclosed in addition to those presented. In embodiments, as further non-limiting examples, a spacing between a signal line and a conductive surface may be substantially thick such that removal of a portion of a conductive surface may not be included. In embodiments, an outer conductor which forms a signal line for a modified coplanar waveguide mode may be attached on ends of an apparatus and/or disposed above a conductive surface, and/or in any suitable manner. In embodiments, one or more waveguide structures may be supported. In embodiments, a cross member may not be employed, for example when a waveguide structure is attached to a ground plane that may provide a bridge across an aperture portion 170 in conductive surface 190. In embodiments, the shape of any component of an apparatus may be any desired geometry, for example circular, rectangular, V-shape, etc. In embodiments, for example, an outer conductor port may have a V-shape, an inner conductor and/or an outer conductor may have a spherical shape, etc.

The exemplary embodiments described herein in the context of a coaxial transmission line for electromagnetic energy may find application, for example, in the telecommunications industry in radar systems and/or in microwave and millimeter-wave devices. In embodiments, however, exemplary structures and/or processes may be used in numerous fields for microdevices such as in pressure sensors, rollover sensors; mass spectrometers, filters, microfluidic devices, surgical instruments, blood pressure sensors, air flow sensors, hearing aid sensors, image stabilizers, altitude sensors, and autofocus sensors.

Therefore, it will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A waveguide balun apparatus, comprising:
   a. a conductive surface configured to provide a ground plane for the balun;
   b. first and second waveguide structures extending along respective longitudinal paths above the conductive surface, the first and second waveguide structures each including an outer conductor in electrical communication with the conductive surface and an inner conductor disposed inside and spaced apart from the outer conductor, wherein the inner conductor of the first waveguide structure and the inner conductor of the second waveguide structure are electrically connected to one another at respective selected ends of the first and second waveguide structures;
   c. first and second longitudinally extending apertures disposed in the conductive surface at a location below the first and second waveguide structures, respectively, each aperture dimensioned to extend along the longitudinal path of the respective waveguide structure;
   d. first and second elongated probes electrically connected at the selected end to, and extending away from, the outer conductors of the first and second waveguide structures, respectively; and
   e. two probe sidewalls electrically connected to the conductive surface and extending upward from the conductive surface on either side of each of the first and second elongated probes to provide a grounded U-shaped channel about each of the first and second elongated probes.

2. The waveguide balun apparatus of claim 1, wherein the longitudinal path of the first waveguide structure comprises a meandered path.

3. The waveguide balun apparatus of claim 1, wherein the first elongated probe tapers to a pointed tip.

4. The waveguide balun apparatus of claim 1, wherein one or more conductive cross members are disposed across the first and second apertures.

5. The waveguide balun apparatus of claim 1, wherein the first waveguide structure has a width and the first aperture has a width greater than the width of the first waveguide structure.

6. The waveguide balun apparatus of claim 1, wherein the first waveguide structure has a width and the first aperture has a width less than the width of the first waveguide structure.

7. The waveguide balun apparatus of claim 1, comprising a substrate disposed between the conductive surface and the first and second waveguide structures.

8. The waveguide balun apparatus of claim 1, comprising a first substrate disposed between the first aperture and the first waveguide structure, and a second substrate separated from the first substrate and disposed between the second aperture and the second waveguide structure.

9. A waveguide balun apparatus, comprising:
   a. a conductive surface configured to provide a ground plane for the balun;
   b. first and second waveguide structures extending along respective longitudinal paths above the conductive surface, the first and second waveguide structures each including an outer conductor in electrical communication with the conductive surface and an inner conductor disposed inside and spaced apart from the outer conductor, wherein the inner conductor of the first waveguide structure and the inner conductor of the second waveguide structure are electrically connected to one another at respective selected ends of the first and second waveguide structures;
   c. a substrate disposed between the conductive surface and the first and second waveguide structures;
   d. first and second elongated probes electrically connected at the selected end to, and extending away from, the outer conductors of the first and second waveguide structures, respectively; and
   e. two probe sidewalls electrically connected to the conductive surface and disposed on either side of each of the first and second elongated probes to provide a grounded channel about each of the first and second elongated probes.

10. The waveguide balun apparatus of claim 9, wherein the longitudinal path of the first waveguide structure comprises a meandered path.

11. The waveguide balun apparatus of claim 9, wherein the first elongated probe tapers to a pointed tip.

12. The waveguide balun apparatus of claim 9, wherein the substrate comprises a first substrate portion disposed between the first waveguide structure and the conductive surface, and a second substrate portion separate from the first substrate portion and disposed between the second waveguide structure and the conductive surface, and wherein the first substrate portion has a width greater than the width of the first waveguide structure.

13. The waveguide balun apparatus of claim 12, wherein the probe sidewalls extend upward from the conductive surface to provide a grounded U-shaped channel.

14. The waveguide balun apparatus of claim 12, wherein the first substrate portion is dimensioned to extend along the longitudinal path of the first waveguide structure.

15. The waveguide balun apparatus of claim 9, wherein the substrate comprises a first substrate portion disposed between the first waveguide structure and the conductive surface, and a second substrate portion separate from the first substrate portion disposed between the second waveguide structure and the conductive surface, and wherein the first substrate portion has a width less than the width of the first waveguide structure.

16. A method of fabricating a waveguide balun apparatus, comprising:
    a. providing a conductive surface configured to provide a ground plane for the balun;
    b. forming first and second waveguide structures extending along respective longitudinal paths above the conductive surface, the first and second waveguide structures each including an outer conductor in electrical communication with the conductive surface and an inner conductor disposed inside and spaced apart from the outer conductor, wherein the inner conductor of the first waveguide structure and the inner conductor of the second waveguide structure are electrically connected to one another at respective selected ends of the first and second waveguide structures;
    c. forming first and second elongated probes electrically connected at the selected end to, and extending away from, the outer conductors of the first and second waveguide structures, respectively; and
    d. forming two probe sidewalls electrically connected to the conductive surface and disposed on either side of each of the first and second elongated probes to provide a grounded channel about each of the first and second elongated probes.

17. The method of claim 16, wherein the conductive surface includes first and second longitudinally extending apertures disposed therein at a location below the first and second waveguide structures, respectively, each aperture dimensioned to extend along the longitudinal path of the respective waveguide structure.

18. The method of claim 16, comprising provide a substrate disposed between the conductive surface and the first and second waveguide structures.

19. The method of claim 18, wherein the substrate comprises a first substrate portion disposed between the first waveguide structure and the conductive surface, and a second substrate portion separate from the first substrate portion disposed between the second waveguide structure and the conductive surface, and wherein the first substrate portion has a width greater than the width of the first waveguide structure.

20. The method of claim 19, wherein the first substrate portion is dimensioned to extend along the longitudinal path of the first waveguide structure.

21. The method of claim 18, wherein the substrate comprises a first substrate portion disposed between the first waveguide structure and the conductive surface, and a second substrate portion separate from the first substrate portion disposed between the second waveguide structure and the conductive surface, and wherein the first substrate portion has a width less than the width of the first waveguide structure.

22. The method of any one of claims 16-20, wherein the method of fabricating includes a sequential build process comprising disposing a plurality of layers over the conductive surface,
    wherein the layers comprise layers of a conductive material and layers of a sacrificial material, thereby forming a layered structure above the conductive surface comprising the first and second waveguide structures, the first and second elongated probes, and the two probe sidewalls.

* * * * *